United States Patent
Takita et al.

(10) Patent No.: US 8,543,957 B2
(45) Date of Patent: Sep. 24, 2013

(54) OPTICAL NETWORK DESIGN APPARATUS AND METHOD

(75) Inventors: Yutaka Takita, Kawasaki (JP); Tomohiro Hashiguchi, Kawasaki (JP); Kazuyuki Tajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 195 days.

(21) Appl. No.: 13/152,486

(22) Filed: Jun. 3, 2011

(65) Prior Publication Data
US 2012/0054710 A1  Mar. 1, 2012

(30) Foreign Application Priority Data
Aug. 27, 2010 (JP) .................. 2010-191173

(51) Int. Cl.
*G06F 17/50* (2006.01)
(52) U.S. Cl.
USPC .............. 716/130; 398/43; 398/45; 398/52; 398/53; 398/68; 398/70; 370/230
(58) Field of Classification Search
USPC .............. 370/228, 230; 398/59, 43, 45, 52, 398/53, 68, 70
See application file for complete search history.

(56) References Cited

U.S. PATENT DOCUMENTS
6,744,727 B2 *  6/2004  Liu et al. .................. 370/228
2008/0037988 A1 *  2/2008  Bullock .................... 398/59

FOREIGN PATENT DOCUMENTS
JP        2001-060922 A      3/2001

* cited by examiner

*Primary Examiner* — Melanie Jagannathan
*Assistant Examiner* — Parth Patel
(74) *Attorney, Agent, or Firm* — Fujitsu Patent Center

(57) ABSTRACT

An optical network design apparatus includes a memory and a processor. The memory stores a connection limit corresponding to the number of connections between ports. The processor provisionally designs a traffic path across an optical network independently of a connection limit of an asymmetric optical hub, calculates a penalty allowance with respect to the penalty limit of the traffic path, calculates an additional penalty caused on a detour path derived by replacing a port with a replacement port in the asymmetric optical hub, and if an asymmetric optical hub is included in the detour path, generates asymmetric optical hub information about the included asymmetric optical hub, generates, based on the connection limit, penalty allowance, additional penalty, and asymmetric optical hub information, a constraint condition for adopting the traffic path satisfying the connection limit and penalty limit, and calculates the traffic path by mathematical programming under the constraint condition.

11 Claims, 28 Drawing Sheets

| | P0 | P1 | P2 | P3 | P4 | P5 | P6 | P7 | P8 |
|---|---|---|---|---|---|---|---|---|---|
| P0 | | 1 | X | X | 3 | 5<br>AH:X(P2–P3)<br>AH:Y(P1–P5) | X | X | X |
| P1 | 1 | | X | X | 2<br>AH:X(P2–P3) | 4<br>AH:X(P2–P3)<br>AH:Y(P1–P5) | X | X | X |
| P2 | X | X | | 5 | X | X | X | X | X |
| P3 | X | X | 5 | | X | X | X | X | X |
| P4 | 3 | 2<br>AH:X(P2–P3) | X | X | | 2<br>AH:Y(P1–P5) | X | X | X |
| P5 | 5<br>AH:X(P2–P3)<br>AH:Y(P1–P5) | 4<br>AH:X(P2–P3)<br>AH:Y(P1–P5) | X | X | 2<br>AH:Y(P1–P5) | | X | X | X |
| P6 | X | X | X | X | X | X | | X | X |
| P7 | X | X | X | X | X | X | X | | 0 |
| P8 | X | X | X | X | X | X | X | 0 | |

(REPLACEMENT PORT) / (TARGET PORT)

FIG. 11

| Target Connection | Detour Path |
|---|---|
| P0-P1 | A-Hub need not be passed |
| P0-P2 | No detour path available |
| ⋮ | ⋮ |
| P1-P5 | P1-P4 & A-HubY(P1-P5) |
| ⋮ | ⋮ |

FIG. 23

| Start Point | End Point |
|---|---|
| AB | BB |
| AB | CB |
| AB | DB |
| AB | GB |
| AB | HB |
| BB | CB |
| BB | DB |
| BB | GB |
| BB | FB |
| CB | DB |
| CB | GB |
| CB | HB |
| DB | GB |
| DB | HB |
| GB | HB |
| BP | CP |
| BP | DP |
| BP | EP |
| BP | GP |
| BP | HP |
| BP | IP |
| CP | DP |
| CP | EP |
| CP | GP |
| CP | HP |
| CP | IP |
| DP | EP |
| DP | GP |
| DP | HP |
| DP | IP |
| EP | GP |
| EP | HP |
| EP | IP |
| GP | HP |
| GP | IP |
| HP | IP |

| Start Point | End Point |
|---|---|
| AY | BY |
| AY | CY |
| AY | FY |
| AY | GY |
| AY | HY |
| BY | CY |
| BY | FY |
| BY | GY |
| BY | HY |
| CY | FY |
| CY | GY |
| CY | HY |
| FY | GY |
| FY | HY |
| GY | HY |
| BG | CG |
| BG | EG |
| BG | FG |
| BG | GG |
| BG | HG |
| BG | IG |
| CG | EG |
| CG | FG |
| CG | GG |
| CG | HG |
| DG | IG |
| EG | FG |
| EG | GG |
| EG | HG |
| EG | IG |
| FG | GG |
| FG | HG |
| FG | IG |
| GG | HG |
| GG | IG |
| HG | IG |

| Start Point | End Point | Distance | Path | | | | | |
|---|---|---|---|---|---|---|---|---|
| AB | BB | 9 | A | BB | | | | |
| AB | CB | 6 | A | B | CB | | | |
| AB | DB | 18 | A | C | E | D | DB | |
| AB | GB | 17 | A | C | E | G | GB | |
| AB | HB | 19 | A | C | E | H | HB | |
| AB | CB | 11 | A | E | A | C | CB | |
| BB | DB | 9 | B | A | C | E | D | DB |
| BB | GB | 22 | B | A | D | E | G | GB |
| BB | FB | 24 | B | A | C | E | F | FB |
| BB | DB | 19 | B | C | E | D | DB | |
| CB | GB | 18 | C | F | E | G | GB | |
| CB | HB | 20 | C | F | E | H | HB | |
| DB | GB | 15 | D | E | G | GB | | |
| DB | HB | 17 | D | E | H | HB | | |
| GB | HB | 16 | G | E | H | HB | | |
| BP | CP | 16 | B | D | DP | CP | | |
| BP | DP | 11 | B | D | DP | | | |
| BP | EP | 11 | B | E | EP | | | |
| BP | GP | 17 | B | E | G | GP | | |
| BP | HP | 23 | B | E | F | G | H | HP |
| BP | IP | 21 | B | E | G | I | IP | |
| CP | DP | 17 | C | E | D | DP | | |
| CP | EP | 9 | C | E | EP | | | |
| CP | GP | 23 | C | E | D | G | GP | |
| CP | HP | 21 | C | E | F | H | HP | |
| CP | IP | 19 | C | E | G | I | IP | |
| DP | EP | 12 | D | E | EP | | | |
| DP | GP | 23 | D | E | G | GP | | |
| DP | HP | 16 | D | E | F | H | HP | |
| DP | IP | 18 | D | E | G | I | IP | |
| EP | GP | 16 | E | G | GP | | | |
| EP | HP | 14 | E | F | H | HP | | |
| EP | IP | 17 | E | G | I | IP | | |
| GP | HP | 10 | G | H | HP | | | |
| GP | IP | 11 | G | I | IP | | | |
| HP | IP | | H | I | IP | | | |

| Start Point | End Point | Distance | Path | | | | | |
|---|---|---|---|---|---|---|---|---|
| AY | BY | 18 | A | C | E | B | BY | |
| AY | CY | 9 | A | C | CY | | | |
| AY | FY | 18 | A | C | E | F | FY | |
| AY | GY | 18 | A | C | E | G | GY | |
| AY | HY | 20 | A | C | E | H | HY | |
| BY | CY | 15 | B | E | C | CY | | |
| BY | FY | 14 | B | E | F | FY | | |
| BY | GY | 14 | B | E | G | GY | | |
| BY | HY | 16 | B | E | H | HY | | |
| CY | FY | 15 | C | E | F | FY | | |
| CY | GY | 15 | C | E | G | GY | | |
| CY | HY | 17 | C | E | H | HY | | |
| FY | GY | 16 | F | E | G | GY | | |
| FY | HY | 16 | F | E | H | HY | | |
| GY | HY | 15 | G | E | H | HY | | |
| BG | CG | 9 | B | C | CG | | | |
| BG | EG | 17 | B | E | EG | | | |
| BG | FG | 14 | B | C | E | F | FG | |
| BG | GG | 22 | B | C | E | G | GG | |
| BG | HG | 19 | B | C | E | F | H | HG |
| BG | IG | 8 | B | C | E | G | I | IG |
| CG | EG | 16 | C | E | EG | | | |
| CG | FG | 13 | C | E | F | FG | | |
| CG | GG | 21 | C | E | G | GG | | |
| CG | HG | 18 | C | E | F | H | HG | |
| CG | IG | 10 | C | E | G | I | IG | |
| EG | FG | 7 | E | F | FG | | | |
| EG | HG | 15 | E | F | H | HG | | |
| EG | IG | 12 | E | G | I | IG | | |
| FG | HG | 15 | F | H | HG | | | |
| FG | IG | 11 | F | G | I | IG | | |
| GG | HG | 20 | G | F | H | HG | | |
| GG | IG | 15 | G | I | IG | | | |
| HG | IG | 7 | H | G | I | IG | | |
| | | 10 | | | | | | |

OPTICAL NETWORK DESIGN APPARATUS AND METHOD

CROSS-REFERENCE TO RELATED APPLICATION

This application is based upon and claims the benefit of priority of the prior Japanese Patent Application No. 2010-191173, filed on Aug. 27, 2010, the entire contents of which are incorporated herein by reference.

FIELD

The embodiments discussed herein are related to optical network design apparatus and method for designing path routing across optical networks

BACKGROUND

In the field of optical networks, various optical devices have recently been developed such as an OADM (Optical Add-Drop Multiplexer) whereby desired wavelengths of optical signals can be added and dropped, and a WXC (Wavelength Cross-Connect) whereby desired wavelengths of optical signals can be re-routed. Such optical devices make it possible to construct networks having complex topologies such as ring interconnection and mesh connection, with the result that the scale of optical networks keeps expanding.

Meanwhile, a WDM (Wavelength Division Multiplexing) network whose scale can be easily expanded at low cost has conventionally been developed for an HCN (Hyper-Cube Network) wherein HCN connection is established between a plurality of nodes by using WDM techniques and AWG (Arrayed Waveguide Grating) techniques (see Japanese Laid-open Patent Publication No. 2001-60922, for example).

As a result of the expansion of the scale of optical networks, however, more and more connection limits have come to be encountered in optical hub facilities. A problem has therefore arisen in that optical network design apparatus for designing path routing across optical networks often fail to provide appropriate routing results with respect to optical networks expanded in scale.

SUMMARY

According to one aspect of the present invention, there is provided an optical network design apparatus for designing path routing across an optical network including an asymmetric optical hub which has a plurality of ports and of which a number of connections between the ports is limited. The optical network design apparatus includes a memory configured to store a connection limit corresponding to the number of connections between the ports; and a processor configured to provisionally design a traffic path across the optical network independently of a connection limit to which the number of connections of the asymmetric optical hub is limited, to calculate a penalty allowance with respect to a penalty limit of the provisionally designed traffic path, to calculate, with respect to the asymmetric optical hub, an additional penalty caused on a detour path which is derived by replacing a port with a replacement port in the asymmetric optical hub, to generate, if an asymmetric optical hub is included in the detour path, asymmetric optical hub information about the asymmetric optical hub included in the detour path, to generate, based on the connection limit, the calculated penalty allowance, the calculated additional penalty, and the generated asymmetric optical hub information, a constraint condition for adopting the traffic path satisfying the connection limit and the penalty limit, and to calculate the traffic path by mathematical programming under the generated constraint condition.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 illustrates an exemplary data structure of a port matrix table;

FIG. 23 illustrates an exemplary data structure of a port matrix table;

FIG. 26 illustrates demands;

FIG. 28 illustrates the results of path calculation by the mathematical programming.

DESCRIPTION OF EMBODIMENTS

Embodiments of the present invention will be described in detail below with reference to the accompanying drawings.

First Embodiment

Figure 1:
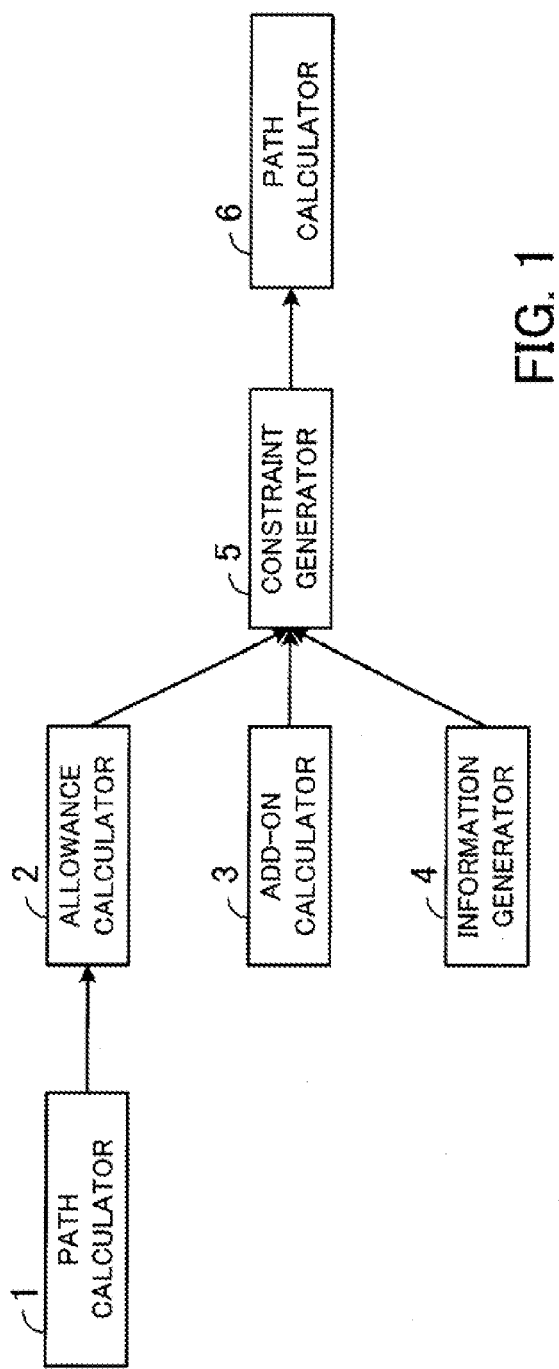
FIG. 1 illustrates an optical network design apparatus according to a first embodiment.

FIG. 1 illustrates an optical network design apparatus according to a first embodiment. As illustrated in FIG. 1, the optical network design apparatus includes path calculators 1 and 6, an allowance calculator 2, an add-on calculator 3, an information generator 4, and a constraint generator 5.

The path calculator 1 provisionally designs a traffic path across an optical network independently of a connection limit to which the number of connections of an asymmetric optical hub is limited.

The allowance calculator 2 calculates a penalty allowance with respect to a penalty limit of the traffic path provisionally designed by the path calculator 1. The penalty limit is, for example, a hop count or transmission delay allowed for the traffic path.

The add-on calculator 3 calculates, with respect to each asymmetric optical hub, an additional penalty caused on a detour path which is derived by replacing a port with a replacement port in the asymmetric optical hub.

Where an asymmetric optical hub is included in the detour path, the information generator 4 generates asymmetric optical hub information about the asymmetric optical hub included in the detour path. For example, the information generator 4 generates connection information about the connection of the asymmetric optical path included in the detour path, through which connection the detour path passes.

The constraint generator 5 generates, based on the connection limit, the penalty allowance calculated by the allowance calculator 2, the additional penalty calculated by the add-on calculator 3 and the asymmetric optical hub information generated by the information generator 4, a constraint condition for adopting a traffic path satisfying the connection limit and the penalty limit.

The path calculator 6 calculates a traffic path by mathematical programming under the constraint condition generated by the constraint generator 5.

In this manner, the optical network design apparatus generates the constraint condition for adopting a traffic path satisfying the connection limit and the penalty limit, on the basis of the connection limit, the penalty allowance, the additional penalty, and the asymmetric optical hub information. Then, under the constraint condition thus generated, the optical network design apparatus calculates a final traffic path by mathematical programming. Consequently, the optical network design apparatus can obtain appropriate path routing results. For example, it is possible to obtain path routing results satisfying the connection limit and the penalty limit.

Second Embodiment

A second embodiment will be now described in detail with reference to the drawings.

Figure 2:
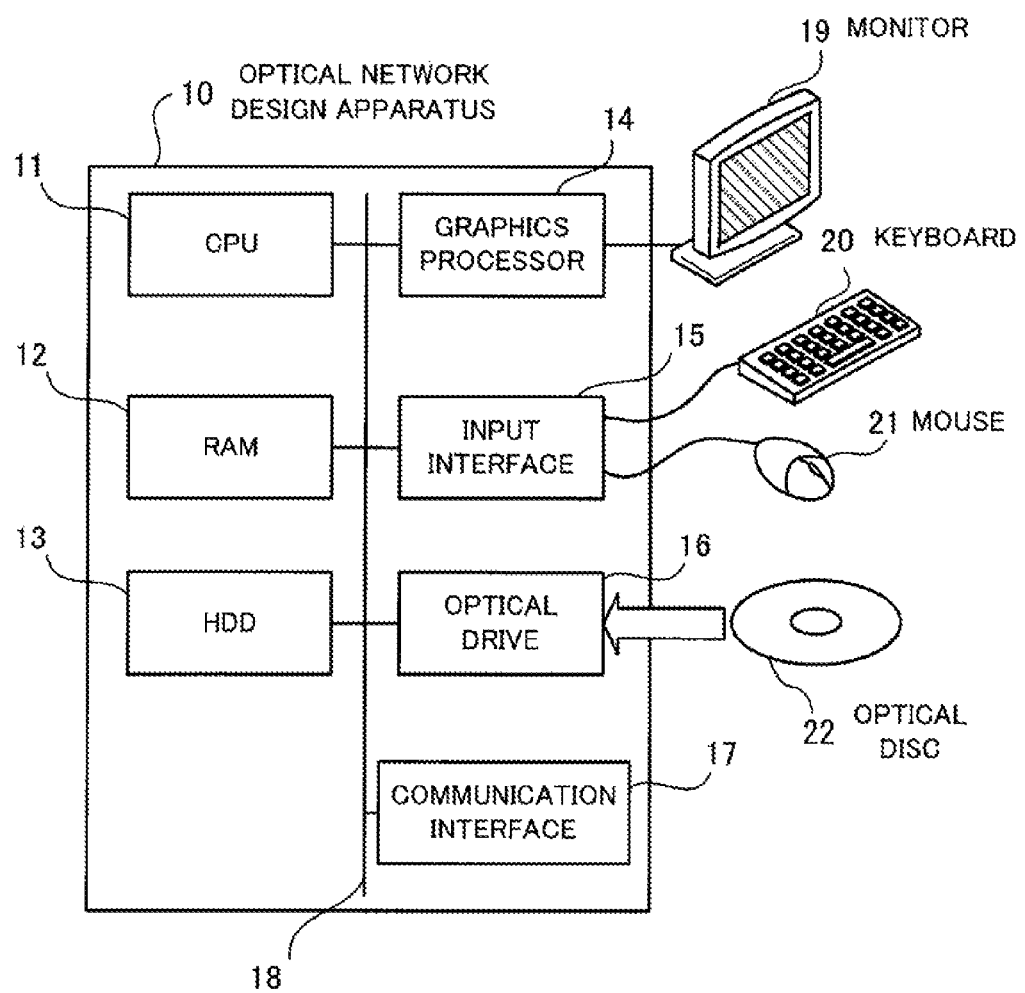
FIG. 2 illustrates an exemplary hardware configuration of an optical network design apparatus according to a second embodiment.

FIG. 2 illustrates an exemplary hardware configuration of an optical network design apparatus according to the second embodiment. The optical network design apparatus 10 is in its entirety under the control of a CPU (Central Processing Unit) 11. The CPU 11 is connected via a bus 18 with a RAM (Random Access Memory) 12 and a plurality of peripheral devices.

The RAM 12 is used as a main memory of the optical network design apparatus 10. The RAM 12 temporarily stores OS (Operating System) programs and at least part of application programs executed by the CPU 11. For example, the RAM 12 temporarily stores at least part of an application program for designing path routing across optical networks. The RAM 12 also stores various data necessary for the processing by the CPU 11.

The peripheral devices connected to the bus 18 include an HDD (Hard Disk Drive) 13, a graphics processor 14, an input interface 15, an optical drive 16, and a communication interface 17.

The HDD 13 magnetically writes and reads data onto and from a built-in disk. The HDD 13 is used as a secondary memory of the optical network design apparatus 10. The HDD 13 stores the OS programs, application programs, and various data. Semiconductor memory such as a flash memory may also be used as the secondary memory.

The graphics processor 14 is connected with a monitor 19. In accordance with instructions from the CPU 11, the graphics processor 14 causes the monitor 19 to display images on its screen. The monitor 19 may be a display device using a CRT (Cathode Ray Tube), or a liquid crystal display device.

The input interface 15 is connected with a keyboard 20 and a mouse 21. The input interface 15 sends signals supplied thereto from the keyboard 20 and the mouse 21 to the CPU 11. The mouse 21 is an example of pointing device and some other pointing device may be used instead. Such pointing devices include touch panel, tablet, touchpad, and trackball.

Using a laser beam or the like, the optical drive 16 reads out data recorded on an optical disc 22. The optical disc 22 is a portable recording medium on which data is recorded in such a manner as to be readable through the reflection of light. Examples of the optical disc 22 include DVD (Digital Versatile Disc), DVD-RAM, CD-ROM (Compact Disc Read Only Memory), CD-R (Recordable), and CD-RW (ReWritable).

The communication interface 17 is connected, for example, to a network such as the Internet. The communication interface 17 permits exchange of data with other computers or communication devices via the network.

The hardware configuration described above enables the optical network design apparatus 10 to perform necessary processing functions to design path routing across optical networks.

Figure 3:
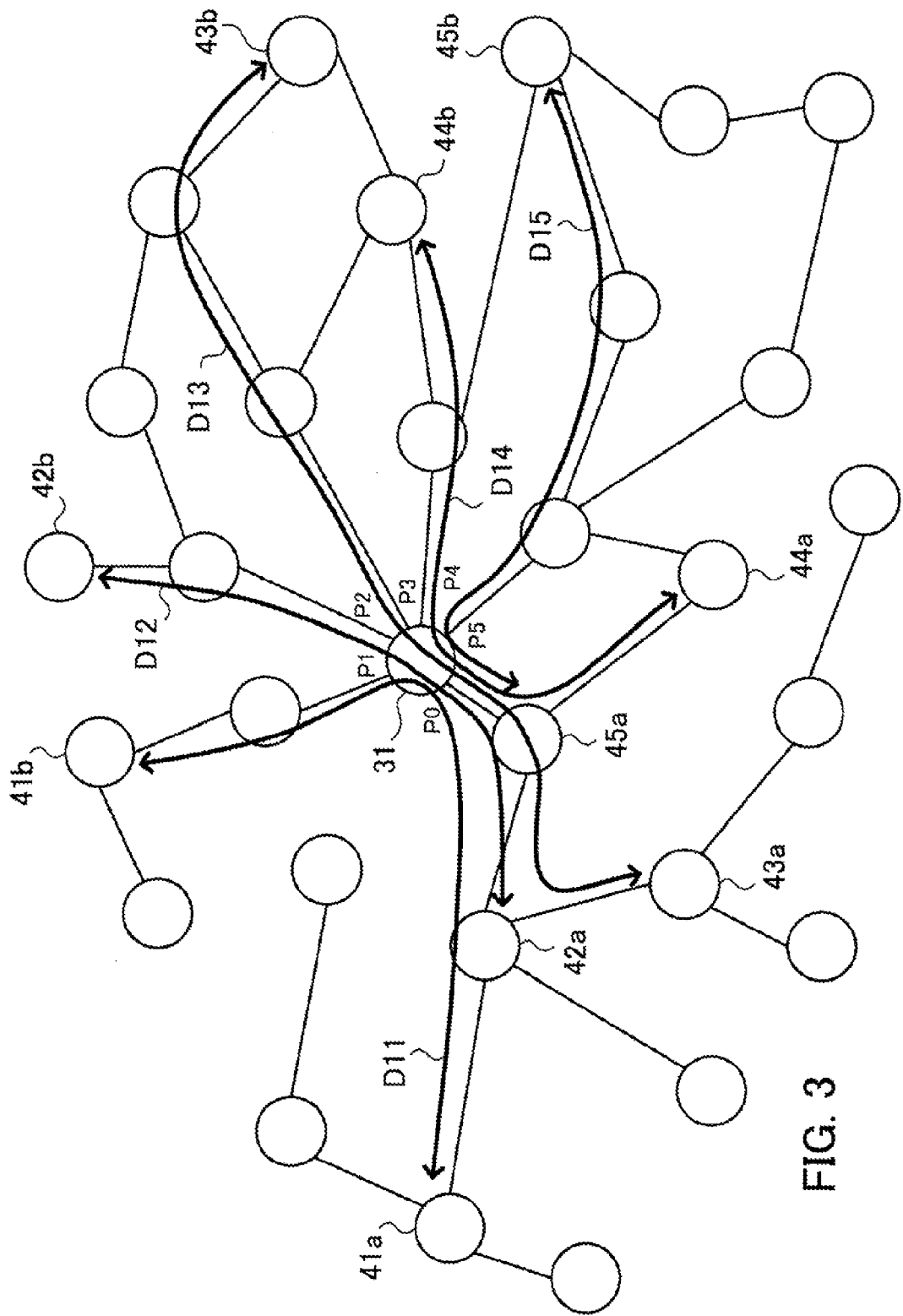
FIG. 3 illustrates an exemplary optical network with respect to which path routing is designed.

FIG. 3 illustrates an exemplary optical network with respect to which path routing is designed. The optical network illustrated in FIG. 3 is constituted by optical hub facilities 31, 41a to 45a, 41b to 45b, and a plurality of other optical hub facilities indicated by circles. The optical hub facility 31 has ports P0 to P5. Likewise, the other optical hub facilities also have respective ports.

The optical network design apparatus 10 holds topology information about the topology of the optical hub facilities constituting the optical network. The topology information may be stored in the HDD 13 of the optical network design apparatus 10 by using, for example, the keyboard 20, the mouse 21, or the optical disc 22. Alternatively, the optical network design apparatus 10 may communicate via the communication interface 17 with the individual optical hub facilities constituting the optical network to acquire the topology information from the optical hub facilities so that the acquired topology information can be stored in the HDD 13.

The topology information includes optical hub facility information, span information, and demand information.

The optical hub facility information includes the number of ports of the optical hub facility (the number of spans extending from the optical hub facility), information identifying the optical hub facility as an asymmetric optical hub facility and a connection limit if the optical hub facility in question is an asymmetric optical hub facility (the asymmetric optical hub facility and the connection limit will be explained later), and parameters necessary for shortest path calculation, such as transmission delay of the connection and cost.

The span information includes information identifying the optical hub facilities at the opposite ends of the span, and parameters necessary for the shortest path calculation, such as transmission delay caused on the span and cost.

The demand information includes information identifying the optical hub facilities at the start and end points, respectively, of a traffic path of which routing design is requested by the operator.

In compliance with the operator's request, the optical network design apparatus 10 designs (calculates) a demand (traffic path from a certain optical hub facility to another).

Let it be assumed, for example, that the optical network design apparatus 10 is requested, by the operator, to calculate paths for a demand specifying the optical hub facilities 41a and 41b as the start and end points, respectively, a demand specifying the optical hub facilities 42a and 42b as the start and end points, respectively, . . . , and a demand specifying the optical hub facilities 45a and 45b as the start and end points, respectively. In this case, the optical network design apparatus 10 calculates, for example, paths D11 to D15 illustrated in FIG. 3. The calculated paths D11 to D15 are displayed at the monitor 19, for example.

Figure 4:
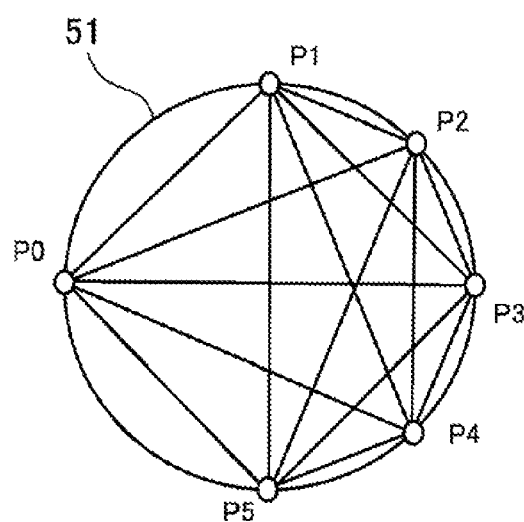
FIG. 4 illustrates a hub facility.

FIG. 4 illustrates a hub facility. The optical hub facility 51 illustrated in FIG. 4 has ports P0 to P5. The optical hub facility 51 is assumed to have no connection limit on its ports P0 to P5.

In this case, in the optical hub facility 51, any one of the ports P0 to P5 can establish a connection with every other of the ports P0 to P5 in a fully meshed fashion, as illustrated in FIG. 4.

Thus, where the optical hub facility 31 illustrated in FIG. 3 has no connection limit, for example, connection can be established between the port P0 and each of the ports P1 to P5 in the optical hub facility 31 in FIG. 3. The optical network design apparatus 10 can therefore calculate the paths D11 to D15 illustrated in FIG. 3.

Figure 5:
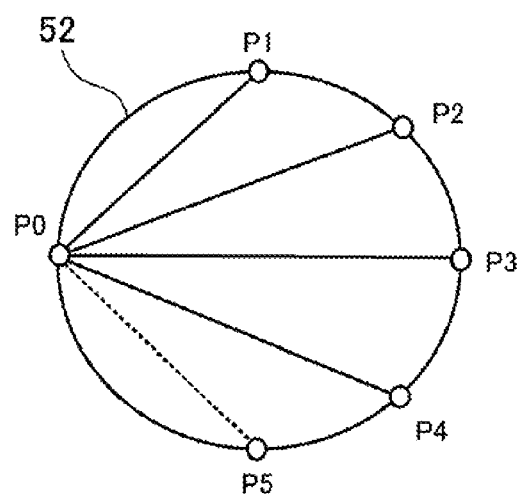
FIG. 5 illustrates an asymmetric optical hub facility.

FIG. 5 illustrates an asymmetric optical hub facility. The optical hub facility 52 illustrated in FIG. 5 has ports P0 to P5. It is assumed here that the optical hub facility 52 of FIG. 5 has a connection limit of "4".

In this case, since the connection limit of the optical hub facility 52 is "4", one port can establish only four connections. Thus, where a connection is established between the port P0 and each of the ports P1 to P4 as illustrated in FIG. 5, no connection can be established between the ports P0 and P5.

Accordingly, if the optical hub facility 31 illustrated in FIG. 3 is an asymmetric optical hub facility having a connection limit of "4", for example, the port P0 of the optical hub facility 31 in FIG. 3 is unable to establish a connection with all of the other ports P1 to P5. Consequently, the paths D11 to D15 illustrated in FIG. 3 fail to be calculated by the optical network design apparatus 10. In this case, the optical network design apparatus 10 designs path routing such that one of the connections between the port P0 and the respective ports P1 to P5 is diverted, for example.

The optical hub facility having a connection limit to which the number of connections is limited is called asymmetric optical hub facility. The optical hub facility 52 of FIG. 5 is an asymmetric optical hub facility. In the following, the asymmetric optical hub facility is referred to also as A-Hub (Asymmetric-Hub).

Figure 6:
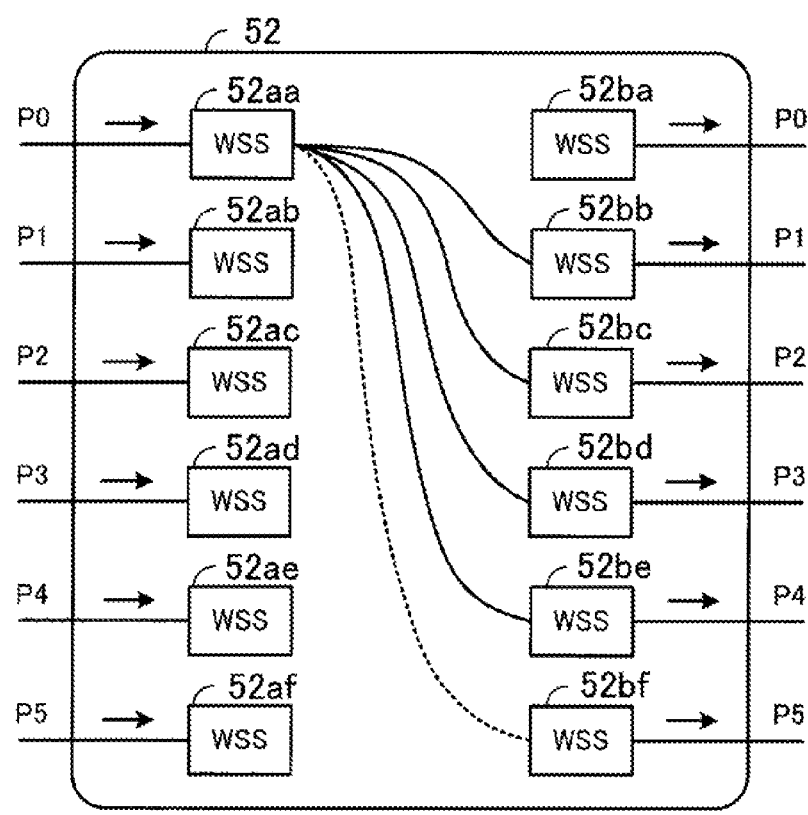
FIG. 6 exemplifies details of the asymmetric optical hub facility.

FIG. 6 exemplifies details of the asymmetric optical hub facility. Specifically, FIG. 6 illustrates in detail the optical hub facility 52 of FIG. 5. The optical hub facility 52 includes WSSs (Wavelength Selective Switches) 52aa to 52af and 52ba to 52bf. The optical hub facility 52 is equipped with a rack, for example, and the boards of the WSSs 52aa to 52af and 52ba to 52bf are placed on the shelves of the rack.

Ports P0 to P5 illustrated in FIG. 6 respectively correspond to the ports P0 to P5 illustrated in FIG. 5. In FIG. 6, each of the ports P0 to P5 is illustrated as two separate ports, and the ports are illustrated as such because, in FIG. 6, the input and output of each of the ports P0 to P5 are indicated separately.

The optical hub facility 52 is assumed to have a connection limit of "4" as stated above with reference to FIG. 5. In this case, the optical network design apparatus 10 is unable to set a connection for the fifth demand, for example, as indicated by the dotted line in FIG. 6.

Conventional optical networks are small in scale, and violation of the connection limit rarely occurred at the time of designing path routing. In recent years, however, the scale of optical networks has expanded, resulting in an increase in the number of demands with respect to which path routing needs to be designed. Thus, more and more connections have to be set during the path calculation for demands, often creating a situation where the connection indicated by the dotted line in FIG. 5, for example, needs to be set. Where the complexity of the topology information increases due to the expanded scale of optical networks and also the number of optical hub facilities with a connection limit increases, the path calculation takes time. For example, with a method in which whether the connection limit is violated or not is determined each time a path for one demand is calculated and the demand is recalculated if the connection limit is violated, much time is required for the path calculation.

It is conceivable that the number of the output ports of the WSSs 52aa to 52af and 52ba and 52bf is increased (the connection limit is raised) to avoid violation of the connection limit. In view of the cost and the like of WSSs, however, it is not desirable that the number of the output ports of the WSSs 52aa to 52af and 52ba to 52bf be increased.

Even in the case of an optical network expanded in scale and including asymmetric optical hub facilities, the optical network design apparatus 10 is capable of shortening the time necessary for path routing design. Also, the optical network design apparatus 10 can derive path routing results optimized for the entire optical network (fulfilling constraint conditions described later).

Figure 7:
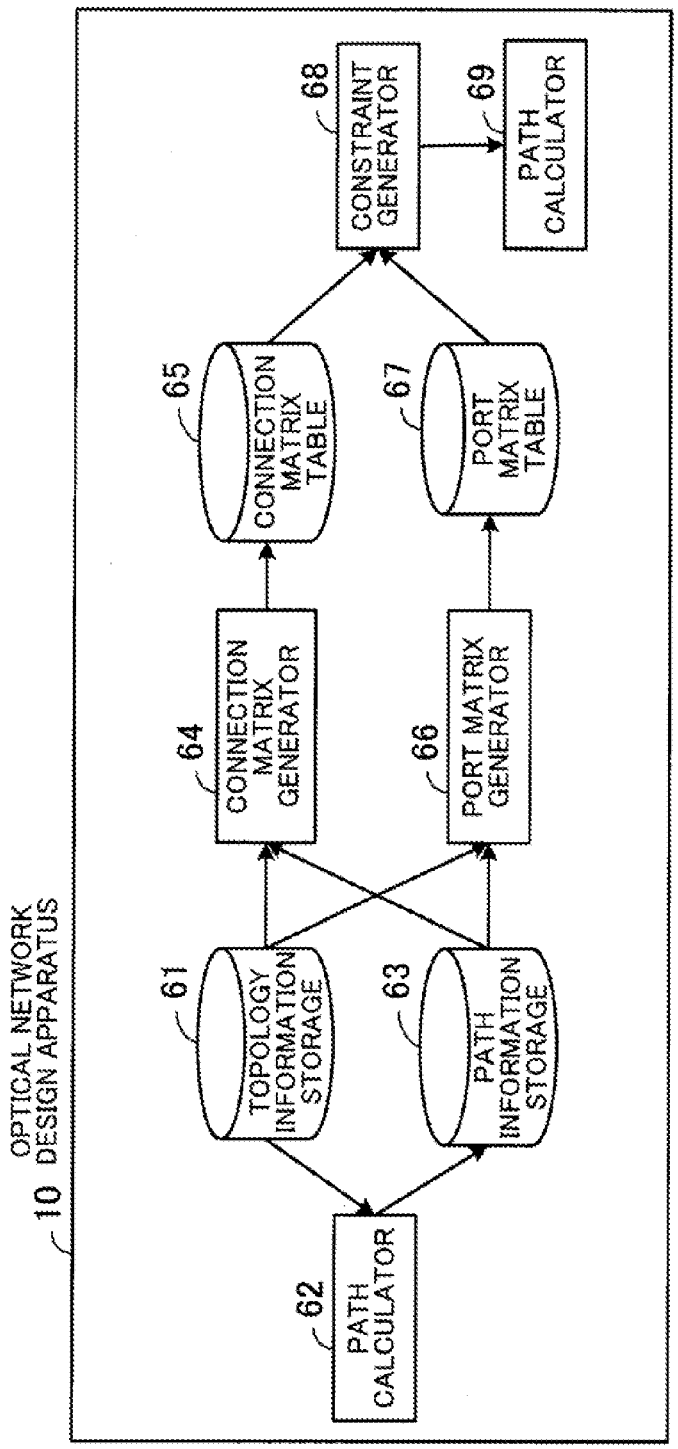
FIG. 7 is a functional block diagram of the optical network design apparatus.

FIG. 7 is a functional block diagram of the optical network design apparatus. As illustrated in FIG. 7, the optical network design apparatus 10 includes a topology information storage 61, a path calculator 62, a path information storage 63, a connection matrix generator 64, a connection matrix table 65, a port matrix generator 66, a port matrix table 67, a constraint generator 68, and a path calculator 69.

The topology information storage 61 stores the topology information explained above with reference to FIG. 3.

The path calculator 62 looks up the topology information stored in the topology information storage 61 and calculates a demanded path by a shortest path search algorithm such as Dijkstra's algorithm, for example, without regard to the connection limit of A-Hubs. Namely, the path calculator 62 calculates a path matching the operator's demand on the assumption that the A-Hubs have no connection limit. Then, the path calculator 62 stores the calculated demanded path in the path information storage 63. The path calculator 62 corresponds, for example, to the path calculator 1 in FIG. 1.

The connection matrix generator 64 looks up the topology information storage 61 and the path information storage 63 to generate a connection matrix, and stores the generated connection matrix in the connection matrix table 65. The connection matrix generator 64 generates the connection matrix with respect to all A-Hubs included in the optical network, and stores the connection matrices in the connection matrix table 65. The connection matrix generator 64 corresponds, for example, to the allowance calculator 2 in FIG. 1.

Prior to proceeding to the explanation of the connection matrix table 65, the penalty limit and the penalty allowance will be explained.

For each demand with respect to which a path is to be calculated, a penalty limit is set in advance. The penalty limit is, for example, a hub facility hop count or transmission delay allowed for the demand with respect to which a path is to be calculated. The penalty allowance is a value of the allowance, relative to the penalty limit, of the penalty of the demand whose path has been calculated.

Figure 8:
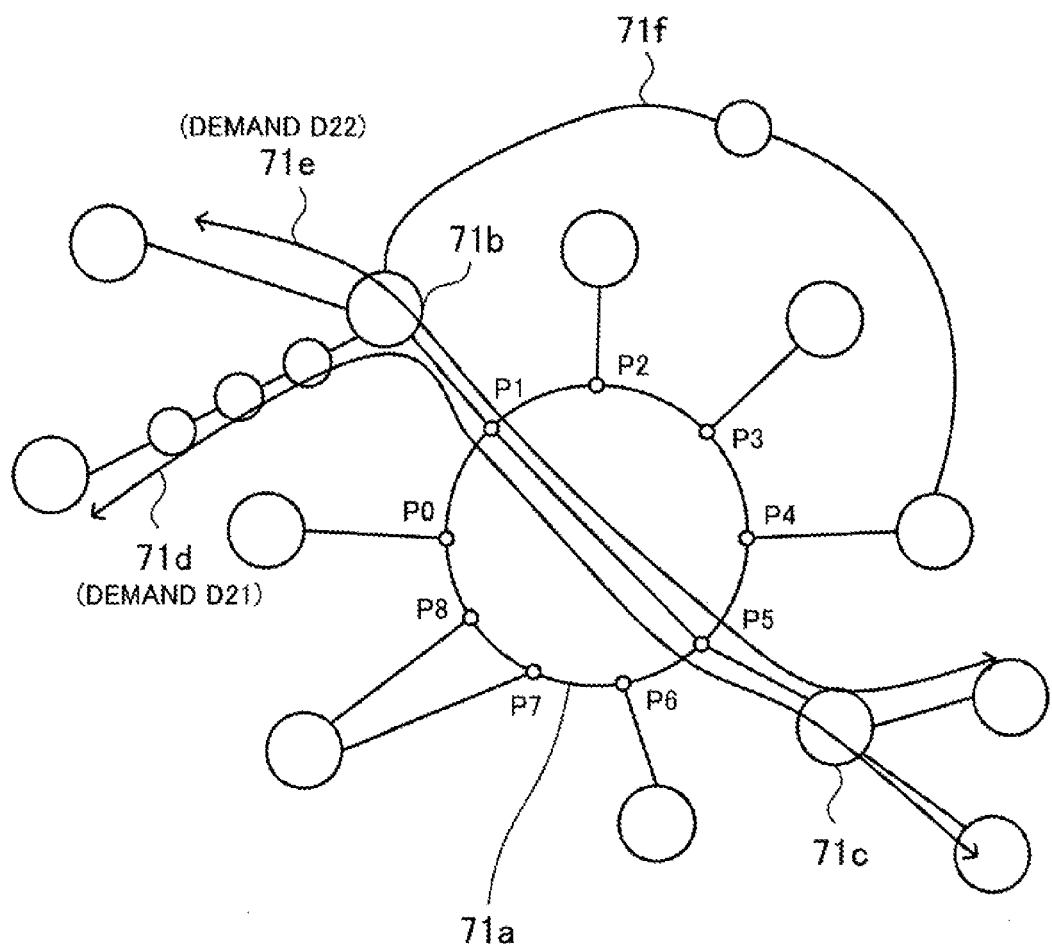
FIG. 8 is a diagram explaining a penalty allowance.

FIG. 8 is a diagram explaining the penalty allowance. Specifically, FIG. 8 illustrates an A-Hub 71a constituting an optical network. The A-Hub 71a has ports P0 to P8. Also, FIG. 8 illustrates ordinary hubs 71b and 71c each capable of full mesh connection. In FIG. 8, circles (except those indicating the ports P0 to P8) also represent hubs. Further, paths 71d and 71e are illustrated in FIG. 8. The path 71d corresponds to a demand D21, and the path 71e corresponds to a demand D22. In FIG. 8, moreover, a path 71f is illustrated which extends between the hub 71b and the hub connected to the port P4.

It is assumed here that the demands D21 and D22 each have a penalty limit of "10" and that as a result of the path calculations by the path calculator 62, the penalty of the path 71d corresponding to the demand D21 and the penalty of the path 71e corresponding to the demand D22 are found to be "4" and "7", respectively. In this case, the penalty allowance of the demand D21 is "6" (=10−4), and the penalty allowance of the demand D22 is "3" (=10−7).

That is, the penalty limit indicates a penalty value allowed for a demanded path, and the penalty allowance indicates an allowance value between the penalty of the demanded path and the penalty limit.

The connection matrix is information indicating the penalty allowance of a demand passing through an A-Hub. After paths are calculated by the path calculator 62, the connection matrix generator 64 focuses on one A-Hub constituting the optical network. Then, with respect to each connection of the currently focused A-Hub, the connection matrix generator 64 calculates the penalty allowance of the demand passing through the A-Hub, and stores the calculated penalty allowance in the connection matrix table 65.

Where a plurality of demanded paths pass through a connection of the A-Hub, the connection matrix generator 64 stores the smallest penalty allowance in the connection matrix table 65. With respect to all A-Hubs constituting the optical network, the connection matrix generator 64 calculates the penalty allowance and stores the calculated penalty allowance in the connection matrix table 65.

Figure 9:
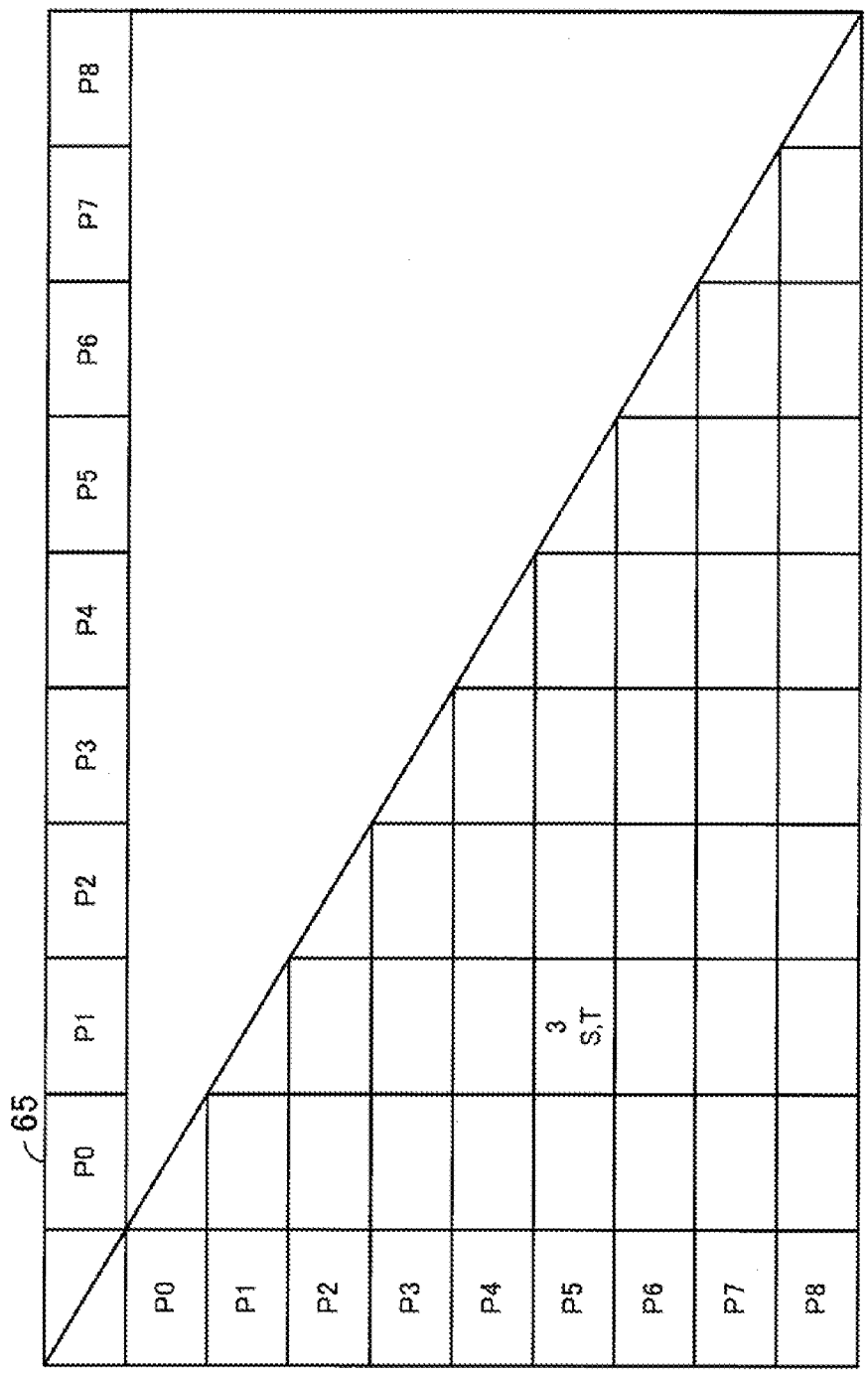
FIG. 9 illustrates an exemplary data structure of a connection matrix table.

FIG. 9 illustrates an exemplary data structure of the connection matrix table. As illustrated in FIG. 9, the connection matrix table 65 has an array of fields indicating ports along vertical and horizontal directions. One port specified along the vertical direction and another port specified along the horizontal direction indicate the connection between these two ports of the A-Hub.

Let it be assumed, for example, that the connection matrix table 65 of FIG. 9 represents the connection matrix of the A-Hub 71a illustrated in FIG. 8. In this case, the port P5 specified along the vertical direction in FIG. 9 and the port P1 specified along the horizontal direction indicate the port connection P1-P5 of the A-Hub 71a in FIG. 8.

In the field where a horizontal row associated with one port and a vertical column associated with another port cross each other, the penalty allowance of the demand passing through that connection is stored. Where a plurality of demands pass through one connection, the smallest penalty allowance is stored.

In the example illustrated in FIG. 8, for example, the paths 71d and 71e corresponding to the demands D21 and D22 pass through the port connection P1-P5. The penalty allowances of the demands D21 and D22 are "6" and "3", respectively, as stated above. Thus, in the field specifying the port P5 in the vertical direction and the port P1 in the horizontal direction, the smallest penalty allowance, namely, "3", is stored as illustrated in FIG. 9.

Also, hub information indicating the opposite ends of a common path shared by demands passing through a connection is stored in the connection matrix table 65.

In FIG. 8, for example, the paths 71d and 71e corresponding to the demands D21 and D22 pass through the port connection P1-P5. The hubs located at the opposite ends of a common path shared by the paths 71d and 71e are the hubs 71b and 71c. Assuming that the identifiers of the hubs 71b and 71c are respectively "S" and "T", for example, "S" and "T" are stored in the field in the connection matrix table 65 where the row of the port P5 specified along the vertical direction and the column of the port P1 specified along the horizontal direction cross each other, as illustrated in FIG. 9. Where only one demanded path passes through a connection, the hubs at the start and end points of the demand are registered as the opposite ends of common path.

As seen from the above, the connection matrix table 65 indicates the allowance value of the demanded path calculated by the path calculator 62 with respect to the penalty limit, and thus indicates a maximum penalty value that is allowed to a detour path where the demanded path passing through the connection of the A-Hub is diverted to the detour path.

Let it be assumed that the path calculator 62 calculates paths across the optical network in the manner described below, for example. As illustrated in FIG. 8, the paths 71d and 71e are calculated for the demands D21 and D22, respectively, and the port P1 of the A-Hub 71a violates the connection limit. In this case, violation of the connection limit by the port P1 can be avoided by, for example, diverting the paths 71d and 71e for the demands D21 and D22 passing through the port connection P1-P5 to the path 71f connected to the port P4 (by replacing the port P1 with the port P4), to establish the port connection P4-P5.

The penalty allowance of the demands D21 and D22 passing through the port connection P1-P5 is found to be "3" at a maximum as soon as the connection matrix table 65 is looked up. Accordingly, the penalty that is allowed to the detour path is "3" at a maximum.

Thus, if the penalty of the path 71f is "3" or lower, the paths 71d and 71e corresponding to the demands D21 and D22 can be diverted to the path 71f and the port connection P4-P5. That is, the penalty limit of the paths 71d and 71e is not exceeded even if the paths 71d and 71e corresponding to the demands D21 and D22 are diverted to the path 71f.

Referring again to FIG. 7, the port matrix generator 66 looks up the topology information storage 61 and the path information storage 63 to generate a port matrix, and stores the generated port matrix in the port matrix table 67. With respect to all A-Hubs included in the optical network, the port matrix generator 66 generates the port matrix and stores the generated port matrix in the port matrix table 67.

Prior to proceeding to the explanation of the port matrix table 67, a replacement port for replacing another port in the A-Hub will be explained.

After paths are calculated by the path calculator 62, the port matrix generator 66 focuses on one A-Hub constituting the optical network. Then, with respect to each port of the currently focused A-Hub, the port matrix generator 66 calculates replacement ports. The replacement port designates a port that can be substituted for another port in the same A-Hub through which a path passes. The port matrix generator 66 corresponds, for example, to the add-on calculator 3 and the information generator 4 illustrated in FIG. 1.

Figure 10:
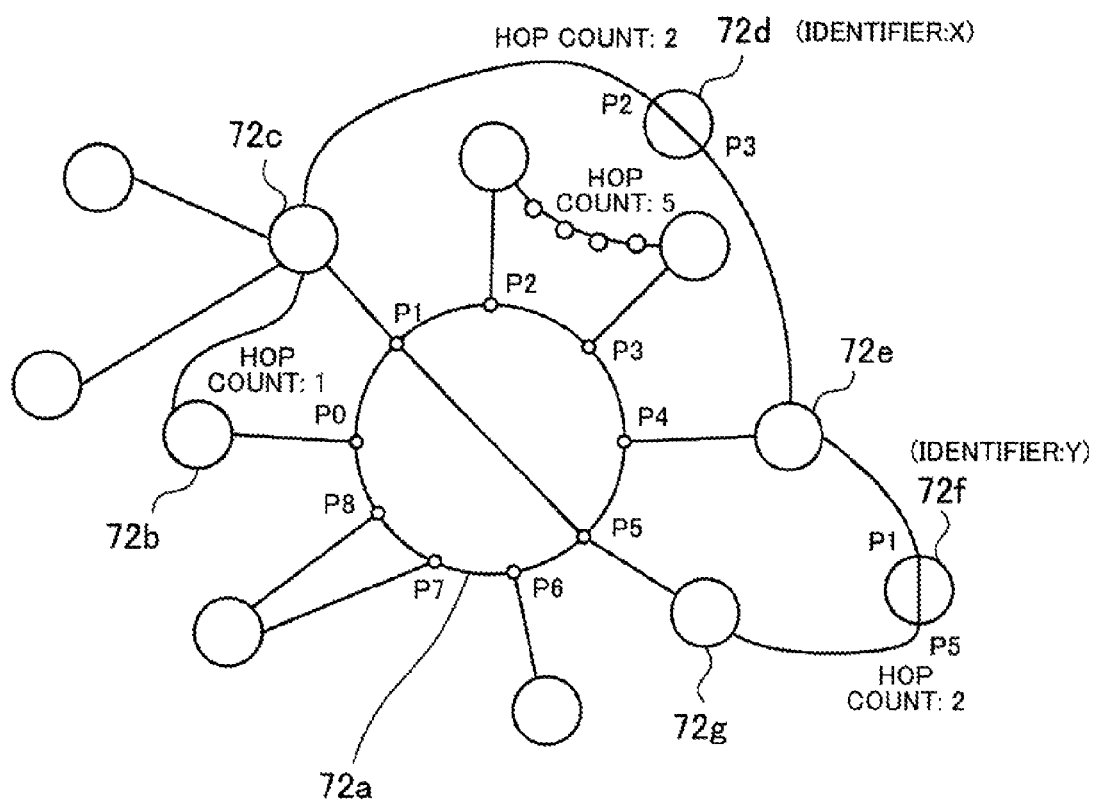
FIG. 10 is a diagram explaining replacement ports.

FIG. 10 is a diagram explaining the replacement ports. Specifically, FIG. 10 illustrates an A-Hub 72a constituting an optical network. The A-Hub 72a has ports P0 to P8.

In addition, FIG. 10 illustrates hubs 72b, 72c, 72e and 72g as well as A-Hubs 72d and 72f. The identifiers of the A-Hubs 72d and 72f are, for example, "X" and "Y", respectively.

To find replacement ports, first, hubs nearest to the currently focused A-Hub are identified. In FIG. 10, assuming that the A-Hub 72a is the currently focused A-Hub, for example, the hubs 72b, 72c, 72e and 72g, the A-Hubs 72d and 72f, the hub connected to the port P6, and the hub connected to the ports P7 and P8 are identified as the nearest hubs.

Subsequently, the optical network is searched for a path or paths connecting between the identified hubs. The path search is conducted by using a shortest path search algorithm such as Dijkstra's algorithm, for example. In the example illustrated in FIG. 10, there are a path connecting between the hubs 72b and 72c, a path connecting between the hubs 72c and 72e via the A-Hub 72d, and a path connecting between the hubs 72e and 72g via the A-Hub 72f.

Where a path connecting between the identified hubs exists, the ports of the currently focused A-Hub connected to the identified hubs are mutually replaceable ports. In the example of FIG. 10, the ports of the A-Hub 72a that can replace the port P1 of the same A-Hub 72a are the ports P0, P4 and P5. That is, the replacement ports for the port P1 are the ports P0, P4 and P5.

The fact that a certain port of an A-Hub has a replacement port means that there is a detour path connecting between the ports. For example, in FIG. 10, since the replacement ports for the port P1 are the ports P0, P4 and P5, a detour path exists for the port connection P1-P0, for the port connection P1-P4, and for the port connection P1-P5.

Thus, where a certain port of an A-Hub violates the connection limit, the calculated demanded path is diverted to a detour path so as to pass through a replacement port, whereby violation of the connection limit by the port with respect to which violation of the connection limit has occurred can be removed.

For example, let us suppose that in the example of FIG. 10, a plurality of demanded paths passing through the hub 72c, the ports P1 and P5 of the A-Hub 72a, and the hub 72g have been calculated by the path calculator 62 and that the port P1 violates the connection limit. In this case, one or more of the calculated paths are diverted, for example, to a detour path passing through the hub 72c, the A-Hub 72d and the hub 72e, and in addition, a connection is established between the ports P4 and P5 of the A-Hub 72a, whereby violation of the connection limit by the port P1 can be removed.

The port matrix generator 66 calculates the replacement ports in the manner described below. The port matrix generator 66 identifies the hubs which are nearest to (which have the smallest hop count with respect to) the individual ports P0 to P8 of the A-Hub 72a, and applies a shortest path search algorithm, such as Dijkstra's algorithm, to the identified hubs. If a path connecting between the identified hubs is found by the shortest path search algorithm, then the ports connected to the identified hubs are mutually replaceable ports.

In FIG. 10, for example, the hubs 72b and 72c are nearest to the A-Hub 72a. Using the shortest path search algorithm, the port matrix generator 66 calculates the shortest path (detour path) between the hubs 72b and 72c. In the example illustrated in FIG. 10, the hubs 72b and 72c are directly connected, and thus the path directly connecting these hubs is derived as the shortest path. Accordingly, the replacement port for the port P0 connected to the hub 72b is the port P1, and the replacement port for the port P1 connected to the hub 72c is the port P0.

Similarly, in FIG. 10, the hubs 72c and 72e are nearest to the A-Hub 72a. The port matrix generator 66 calculates the shortest path between the hubs 72c and 72e by using the shortest path search algorithm. In the example of FIG. 10, the hubs 72c and 72e are connected via the A-Hub 72d, and this path is derived as the shortest path. Thus, the replacement port for the port P1 connected to the hub 72c is the port P4, and the replacement port for the port P4 connected to the hub 72e is the port P1.

Also, in FIG. 10, the hub 72c and the hub connected to the port P2 of the A-Hub 72a are nearest to the A-Hub 72a. Using the shortest path search algorithm, the port matrix generator 66 calculates the shortest path between the hub 72c and the hub connected to the port P2. In the example illustrated in FIG. 10, no path exists between the hub 72c and the hub connected to the port P2, with the result that no shortest path is derived. Thus, the ports P1 and P2 are not mutually replaceable ports.

FIG. 11 illustrates an exemplary data structure of the port matrix table. As illustrated in FIG. 11, the port matrix table 67 has an array of fields indicating ports along vertical and horizontal directions. Target ports are specified along the vertical direction, and replacement ports are specified along the horizontal direction. The port matrix table 67 of FIG. 11 represents the port matrix table of the A-Hub 72a illustrated in FIG. 10.

In the field where the row associated with a target port and the column associated with a replacement port intersect each other, the penalty of the detour path connecting between the target port and the replacement port is stored. In the following, the penalty of a detour path is referred to also as additional penalty.

In FIG. 10, for example, the penalty of the detour path connecting between the target port P1 and the replacement port P4 of the A-Hub 72a is "2" (in FIG. 10, indicated by the hop count). Accordingly, in the field in FIG. 11 where the row of the target port P1 and the column of the replacement port P4 intersect each other, an additional penalty of "2" is stored.

Also, where an A-Hub is included in the detour path connecting between a target port and a replacement port, information about the A-Hub is stored in the field where the row of the target port and the column of the replacement port intersect each other. In addition, port (connection) information on the A-Hub through which the detour path passes is also stored.

For example, in FIG. 10, the A-Hub 72d is included in the detour path connecting between the target port P1 and the replacement port P4 of the A-Hub 72a. Thus, in the field in FIG. 11 where the row associated with the target port P1 and the column associated with the replacement port P4 intersect each other, information (identifier: X) about the A-Hub 72d is stored. The detour path passes through the ports P2 and P3 of the A-Hub 72d. Accordingly, in FIG. 11, information indicating the ports P2 and P3 is stored in the field where the row associated with the target port P1 and the column associated with the replacement port P4 intersect each other.

When calculating a detour path in the aforementioned manner, the port matrix generator 66 calculates the additional penalty of the detour path. Also, during the detour path calculation, the port matrix generator 66 calculates information about the A-Hub included in the detour path as well as information about the ports of the A-Hub. Then, the port matrix generator 66 generates the port matrix table 67 like the one illustrated in FIG. 11.

As described above, the port matrix table 67 holds information about the ports (replacement ports) to which the respective ports of the A-Hub through which a demanded path passes can be diverted. Also, the port matrix table 67 holds information about the penalties (additional penalties) which are caused on the respective detour paths when the ports are replaced by the replacement ports. Thus, by looking up the port matrix table 67, it is possible to ascertain that the port P0, for example, can be replaced by any one of the ports P1, P4 and P5. It is also found that the detour paths, to which the path is diverted when the port is replaced by the respective replacement ports, have penalties of "1", "3" and "5", respectively. Further, it is possible to ascertain that the detour path, to which the path is diverted when the port P0 is replaced by the port P5, includes the A-Hubs 72d and 72f with the identifiers "X" and "Y", respectively, and passes through the ports P2 and P3 of the A-Hub 72d and the ports P1 and P5 of the A-Hub 72f.

Referring again to FIG. 7, the constraint generator 68 looks up the connection matrix table 65 and the port matrix table 67 to generate constraint conditions. Also, the constraint generator 68 generates an objective function. The constraint generator 68 corresponds, for example, to the constraint generator 5 illustrated in FIG. 1. The constraint conditions and the objective function will be described in detail later.

Using mathematical programming, the path calculator 69 calculates a demanded path fulfilling the constraint conditions and objective function generated by the constraint generator 68. The path calculator 69 corresponds, for example, to the path calculator 6 illustrated in FIG. 1.

The constraint conditions will be now explained. The constraint conditions generated by the constraint generator 68 can be roughly classified into two types, one being constraint conditions related to the connection limit of the individual A-Hubs and the other being constraint conditions related to the detour path.

The constraint conditions of the second type, namely, the constraint conditions related to the detour path, are generated from the following constraint standpoints A and B:

Constraint Standpoint A: The penalty of the demanded path does not exceed the penalty limit even if the additional penalty, which is added when the port (the port of the A-Hub through which the demanded path passes) is bypassed, is taken into account.

The constraint standpoint A specifies that the constraint condition is to be generated such that where a certain demanded path is diverted to a detour path (where the port of an A-Hub through which a certain demanded path passes is replaced by a replacement port of the same A-Hub), the detour path also satisfies the penalty limit.

Constraint Standpoint B: Where an A-Hub is included in the currently focused detour path, the connection used in this A-Hub is to be used.

As explained above with reference to FIG. 11, the additional penalty registered in the port matrix table in association with a detour path including an A-Hub indicates the value which is applicable when the detour path passes through the connection of the A-Hub derived by the shortest path search algorithm. Thus, if the detour path does not pass through the connection of the A-Hub registered in the port matrix table 67, the applicable additional penalty may possibly be different. The constraint standpoint B therefore specifies that the constraint condition is to be generated such that where an A-Hub is included in the detour path, the connection used in this A-Hub is to be used.

The constraint condition will be now described in more detail. The constraint generator 68 focuses on one A-Hub constituting the optical network. Then, the constraint generator 68 generates a variable $S_{Ahub}(x, y)$ indicative of a connection candidate within the currently focused A-Hub. The values x and y indicate ports in the currently focused A-Hub, where $x \ne y$.

The variable $S_{Ahub}(x, y)$ assumes the value "0" or "1", which is determined by the path calculator 69. For example, "1" indicates that the connection between the ports x and y has been adopted, and "0" indicates that the connection between the ports x and y was not adopted. "Ahub" in $S_{Ahub}(x, y)$ denotes the name of an A-Hub and specifies the A-Hub with which the variable is associated.

Figure 12:
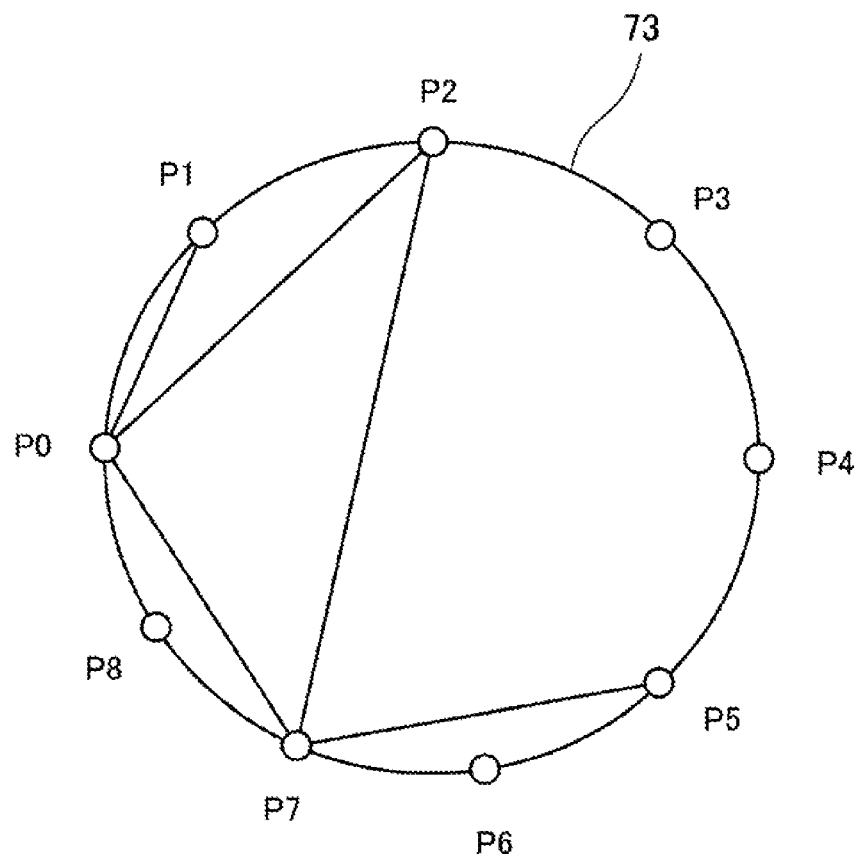
FIG. 12 is a diagram explaining variables.

FIG. 12 is a diagram explaining the variable. Let us suppose that the variables $S_{Ahub}(x, y)$ of an A-Hub 73 illustrated in FIG. 12 are determined by the path calculator 69 as follows:

$S_{Ahub}(P0, P1)=1$
$S_{Ahub}(P0, P2)=1$
$S_{Ahub}(P0, P7)=1$
$S_{Ahub}(P5, P7)=1$
$S_{Ahub}(P2, P7)=1$
$S_{Ahub}(P0, P3)=0$
$S_{Ahub}(P0, P4)=0$
$S_{Ahub}(P0, P6)=0$
$S_{Ahub}(P6, P7)=0$
$S_{Ahub}(P3, P7)=0$ In this case, connections are established in the A-Hub 73 in the manner illustrated in FIG. 12.

The constraint generator 68 generates a constraint condition (first constraint condition) so that a demanded path to be calculated may satisfy the connection limit of the A-Hub. That is, the constraint generator 68 generates a constraint condition such that the path calculator 69 adopts a traffic path so as to satisfy the connection limit. The constraint condition for satisfying the connection limit is indicated by Expression (1) below.

$$\sum_{x \ne N} S_{Ahub}(x, k) \le L_k \qquad (1)$$

k=1, 2, . . . , N $L_k$: Connection limit at port k

The connection limit $L_k$ in Expression (1) is included in the topology information and is input, for example, by the operator.

The left-hand side of Expression (1) indicates a sum total of the variables $S_{Ahub}(x, k)$. The variables $S_{Ahub}(x, k)$ assume the value "0" or "1", as stated above. Thus, keeping the left-hand side of Expression (1) smaller than or equal to $L_k$ means establishing connections so that the A-Hub may satisfy the connection limit $L_k$.

Where $L_k$ in Expression (1) is "5", for example, the connections of the A-Hub illustrated in FIG. 12 satisfy the constraint condition indicated by Expression (1) (Adding together $S_{Ahub}$(P0, P1) through $S_{Ahub}$(P3, P7), indicated above, provides "5").

Subsequently, the constraint generator 68 generates a constraint condition (second constraint condition) related to the detour path. First, the manner of how the constraint condition is generated from the constraint standpoint A will be explained. Where a certain demanded path is to be diverted, the constraint generator generates a constraint condition from the constraint standpoint A such that the detour path also satisfies the penalty limit. Specifically, the constraint generator 68 looks up the connection matrix table 65 and the port matrix table 67 to generate a constraint condition from the constraint standpoint A.

The constraint condition according to the constraint standpoint A is indicated by Expression (2) below. In Expression (2), "Ahub" in the variable $S_{Ahub}(x, y)$ is omitted.

$$S(k, l) + \sum_{x \forall A_k} S(x, l) + \sum_{y \forall A_l} S(k, y) \geq 1 \qquad (2)$$

In Expression (2), $A_k$ and $A_l$ each denote a set of substitutable candidates for a port. The substitutable candidate set is a set of replacement ports whose detour paths satisfy the penalty limit when the path is diverted using the respective replacement ports. In the example illustrated in FIG. 11, the replacement ports for the port P1 are the ports P0, P4 and P5. If the penalty allowance of the path is "3", for example, the port P5 can no longer be a detour path candidate. In this case, therefore, the substitutable candidate set for the port P1 includes the ports P0 and P4.

On the left-hand side of Expression (2), the first term indicates an original connection (the connection derived by the path calculator 62). The second term indicates a set of substitute connections derived by replacing one port of the original connection by the ports included in the substitutable candidate set. The third term indicates a set of substitute connections derived by replacing the other port of the original connection by the ports included in the substitutable candidate set.

Expression (2) requires that a connection be derived so that the value of the left-hand side may be larger than or equal to "1". That is, Expression (2) requires that the original connection, or a connection in the connection set derived by replacing one port of the original connection with the ports included in the substitutable candidate set, or a connection in the connection set derived by replacing the other port of the original connection with the ports included in the substitutable candidate set be selected for the currently focused A-Hub.

Figure 13:
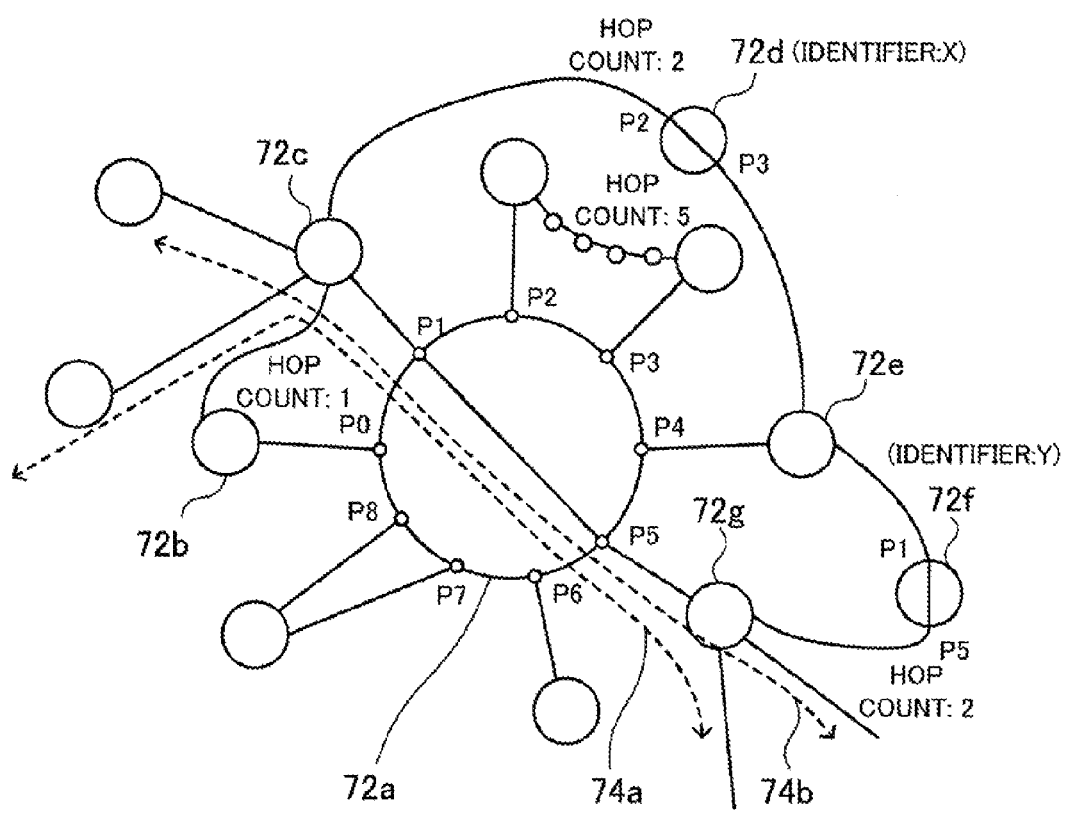
FIG. 13 is a diagram explaining a constraint condition generated from a constraint standpoint A.

FIG. 13 is a diagram explaining the constraint condition according to the constraint standpoint A. In FIG. 13, like reference signs are used to denote like elements also appearing in FIG. 10, and description of such elements is omitted.

Let it be assumed that demanded paths 74a and 74b are derived by the path calculator 62. Also, let us suppose that the identifiers of the hubs 72c and 72g are "S" and "T", respectively, that the penalty limit is "10", and that the penalties of the paths 74a and 74b are "7" and "4", respectively. In this case, the connection matrix table 65 for the A-Hub 72a in FIG. 13 is generated in the manner illustrated in FIG. 9. Also, the port matrix table 67 for the A-Hub 72a in FIG. 13 is generated in the manner illustrated in FIG. 11.

The constraint generator 68 looks up the port matrix table 67 and acquires the port P4 as one of detour paths for the port connection P1-P5. Also, by looking up the port matrix table 67, the constraint generator 68 acquires the additional penalty "2" of the port connection P1-P4.

Then, the constraint generator 68 looks up the connection matrix table 65 and acquires the penalty allowance "3" of the path passing through the port connection P1-P5. Since the additional penalty "2" is smaller than the penalty allowance "3", the constraint generator 68 adds the port P4 to the substitutable candidate set $A_k$.

In like manner, the constraint generator 68 acquires substitutable candidate ports for the port P1 by looking up the port matrix table 67. In the aforementioned instance, the port P0 is a substitutable candidate port for the port P1, while the port P5 is not a substitutable candidate port for the port P1.

That is, the constraint generator 68 acquires a replacement port replaceable for the port P1, and then looks up the connection matrix table 65 and the port matrix table 67 to determine whether or not the detour path of the acquired replacement port satisfies the penalty limit. If the detour path of the replacement port satisfies the penalty limit, the constraint generator 68 adds the replacement port to the substitutable candidate set $A_k$. Similarly, the constraint generator 68 calculates the substitutable candidate set $A_l$ for the port P5.

The constraint generator 68 calculates the substitutable candidate sets $A_k$ and $A_l$ in the aforementioned manner and generates the constraint condition indicated by Expression (2). In the above instance, the constraint generator 68 first acquires the replacement port by looking up the port matrix table 67, and then looks up the connection matrix table 65 to obtain the substitutable candidate set. The order of calculation may, however, be reversed. For example, the constraint generator 68 may first acquire the penalty allowance by looking up the connection matrix table 65, and then look up the port matrix table 67 to obtain the substitutable candidate set.

The generation of the constraint condition from the constraint standpoint B will be now explained. Where an A-Hub is included in the detour path, the constraint generator 68 further generates a constraint condition from the constraint standpoint B. In the example illustrated in FIG. 13, the A-Hub 72d is included in the detour path connecting between the hubs 72c and 72e, and the detour path passes through the port connection P2-P3 of the A-Hub 72d. Thus, where the detour path passing through the A-Hub 72d is to be adopted, the constraint generator 68 generates a constraint condition such that the detour path passes through the port connection P2-P3 of the A-Hub 72d.

Figure 14:
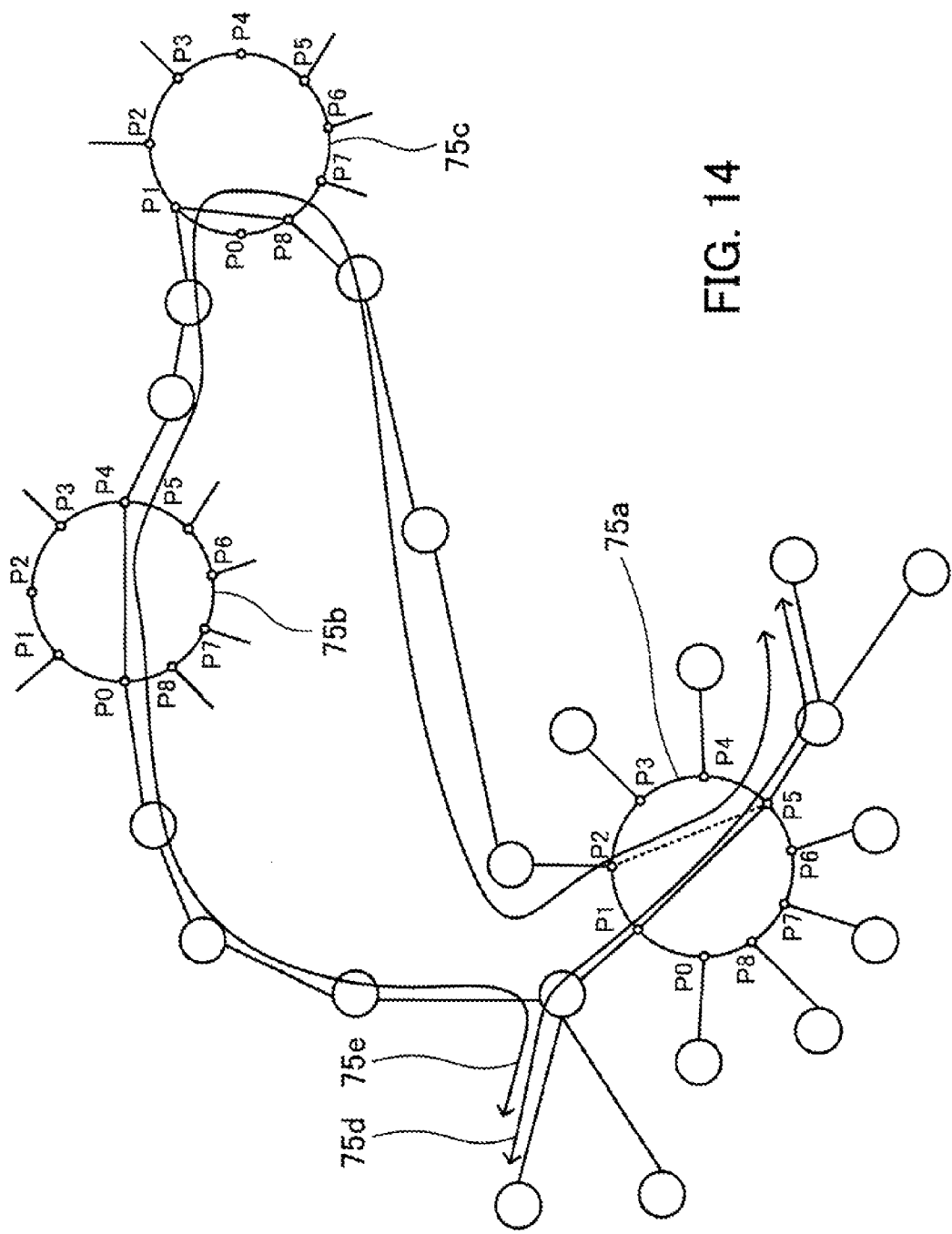
FIG. 14 is a diagram explaining a constraint condition generated from a constraint standpoint B.

FIG. 14 is a diagram explaining the constraint condition according to the constraint standpoint B. In FIG. 14, A-Hubs 75a to 75c constituting an optical network are illustrated. Each of the A-Hubs 75a to 75c has ports P0 to P8. A path 75e indicates a detour path for a path 75d, and it is assumed that in the A-Hubs 75b and 75c through which the path 75e passes, the port connections P0-P4 and P1-P8 are respectively established.

In FIG. 14, in order for the path 75e to qualify as a candidate detour path for the path 75d, the path 75e needs to pass through the ports P0 and P4 of the A-Hub 75b and through the ports P1 and P8 of the A-Hub 75c. This is because the path 75e is calculated by a shortest path search algorithm such as Dijkstra's algorithm, because the information about the A-Hubs 75b and 75c through which the path 75e passes as well as the information about the connections of these A-Hubs are stored in the port matrix table 67, and also because the additional penalties applicable to these connections are registered in the port matrix table 67, as explained above with reference to FIG. 10.

The constraint generator 68 looks up the port matrix table 67 to generate a constraint condition from the constraint standpoint B. If an A-Hub is included in the detour path, the constraint generator 68 generates a constraint condition such that the detour path passes through the connection registered in the port matrix table 67, as stated above.

In the example illustrated in FIG. 14, the constraint generator 68 generates the constraint condition indicated by Expression (3) below, for example.

$$2 \times S_{A\text{-}Hub1}(P2,P5) - S_{A\text{-}Hub2}(P0,P4) - S_{A\text{-}Hub3}(P1,P8) \leq 0 \quad (3)$$

In Expression (3), "A-Hub1", "A-Hub2" and "A-Hub3" succeeding the letter "S" denote that these variables S are associated with the respective A-Hubs 75a to 75c illustrated in FIG. 14.

The variable S in the first term of Expression (3) indicates the variable associated with the port connection P2-P5 of the A-Hub 75a in FIG. 14. The value "2" multiplied by the variable S of the first term indicates the number of the A-Hubs included in the detour path 75e. Thus, if three A-Hubs are included in the detour path 75e, the variable S of the first term is multiplied by "3".

The variable S in the second term of Expression (3) indicates the variable associated with the port connection P0-P4 of the A-Hub 75b in FIG. 14, and the variable S in the third term of Expression (3) indicates the variable associated with the port connection P1-P8 of the A-Hub 75c in FIG. 14.

Expression (3) specifies the constraint condition that the value of the left-hand side of Expression (3) is smaller than or equal to "0". This means that if the port connection P2-P5 of the A-Hub 75a is adopted, the port connection P0-P4 of the A-Hub 75b and the port connection P1-P8 of the A-Hub 75c have to be adopted.

Where the port connection P2-P5 of the A-Hub 75a is adopted, for example, $S_{A\text{-}Hub1}$ (P2, P5) in Expression (3) equals "1". In this case, the second and third terms of Expression (3) have to be "1" each in order to satisfy the relation indicated by Expression (3). That is, the second and third terms have to fulfill the following relations:

$S_{A\text{-}Hub2}(P0, P4) = 1$ $S_{A\text{-}Hub3}(P1, P8) = 1$

This means that the port connection P0-P4 of the A-Hub 75b (A-Hub2) and the port connection P1-P8 of the A-Hub 75c (A-Hub3) are adopted.

With respect to each detour path including an A-Hub, the constraint generator 68 generates a constraint condition from the constraint standpoint B in the aforementioned manner.

The objective function will be now explained.

The objective function is generated by the constraint generator 68. Expression (4) below indicates the objective function, by way of example.

$$\text{Maximize} \sum_{Ahub,x,y \forall N} c_{Ahub,x,y} \cdot S_{Ahub}(x, y) \quad (4)$$

Expression (4) indicates that a weighting factor $c_{Ahub,x,y}$ is applied to the variable S and that all connection candidates within the optical network, represented by S, are added up. In Expression (4), "Maximize" is specified for the objective function, but "Minimize" may be specified instead as the case may be. For example, where the number of the connections used in the A-Hub is to be minimized, "Minimize" may be specified. Also, in Expression (4), "Ahub" in $c_{Ahub,x,y}$ represents the name of an A-Hub, thereby indicating which A-Hub the weighting factor in question is associated with.

The path calculator 69 can obtain various path routing results by varying the weighting factor applied to each variable S in Expression (4). The following Equation (5) exemplifies such weighting. In Equation (5), "Ahub" in $c_{Ahub,x,y}$ is omitted.

$$c_{x,y} = D_{x,y} \cdot (R_{x,y} + \alpha_{x,y}) \cdot HD_{x,y} \quad (5)$$

In Equation (5), $D_{x,y}$ represents the number of the demanded paths belonging to each connection of the A-Hub, derived by the initial provisional design (calculated by the path calculator 62). By introducing this parameter into the objective function, it is possible to calculate paths by the path calculator 69 so that, for the connection of an A-Hub where a large number of demanded paths pass, the current status may be maintained (demanded path may not be diverted) as far as possible.

$R_{x,y}$ is a flag indicating whether or not the connection in question is a connection that was derived by the initial provisional design. By introducing this parameter into the objective function, the path calculator 69 designs path routing so that the connections adopted in the initial provisional design may be preferentially adopted.

In Equation (5), $\alpha_{x,y}$ is a value for a connection that is not used in the initial provisional design at all. By introducing the parameter into the objective function, it is possible to cause the path calculator 69 to adopt, with certain priority, connections that are not used in the initial provisional design.

$HD_{x,y}$ is a parameter whereby, where a demanded path passing through a plurality of A-Hubs is derived by the initial provisional design, the path between the A-Hubs is preferentially adopted. By introducing the parameter into the objective function, the path calculator 69 can be made to preferentially adopt those paths passing through a plurality of A-Hubs which are derived by the initial provisional design.

Figure 15:
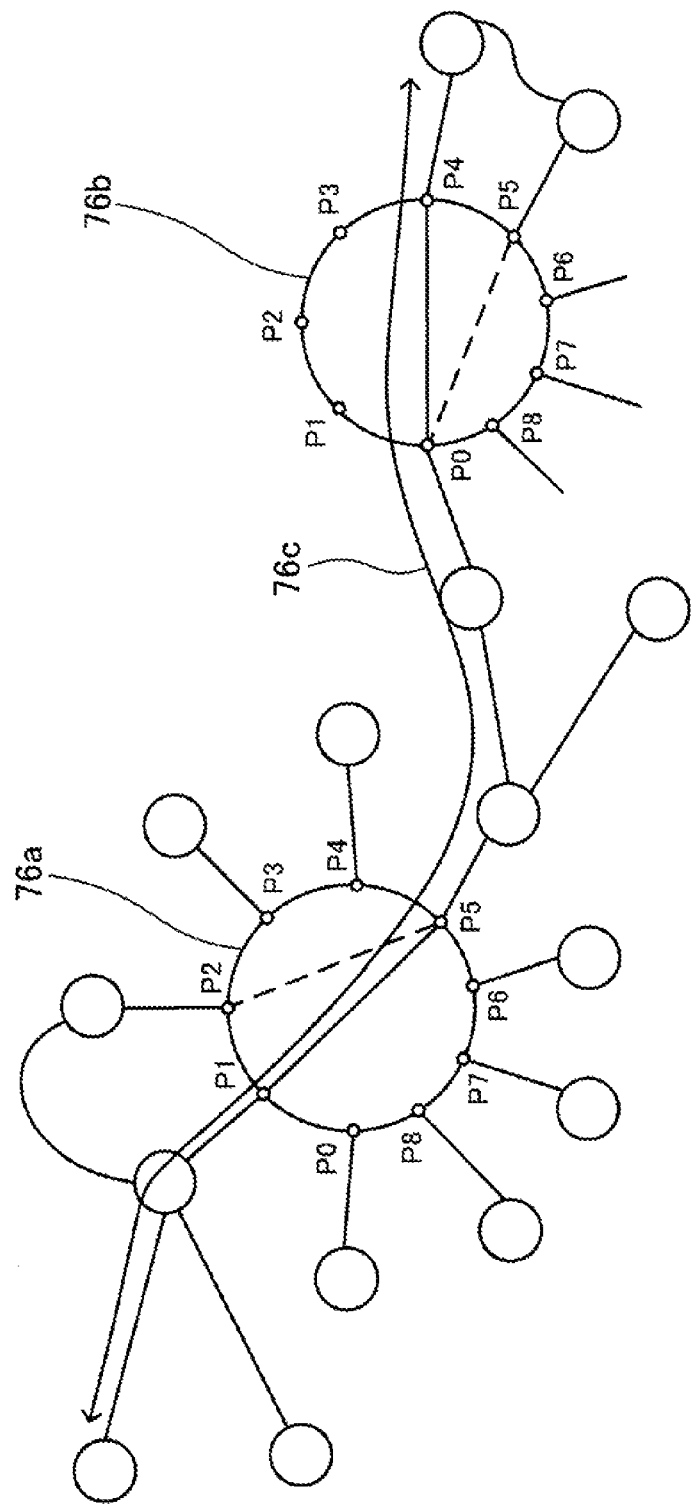
FIG. 15 is a diagram explaining an objective function that preferentially adopts a path passing through a plurality of A-Hubs.

FIG. 15 is a diagram explaining the objective function whereby a path passing through a plurality of A-Hubs is preferentially adopted. In FIG. 15, A-Hubs 76a and 76b constituting an optical network are illustrated. A path 76c indicates a path calculated by the path calculator 62.

The path 76c calculated by the initial provisional design passes through the A-Hubs 76a and 76b. In this case, the constraint generator 68 adjusts $HD_{x,y}$ so that the path between the A-Hubs 76a and 76b may be preferentially adopted by the path calculator 69.

For example, the constraint generator 68 sets "2" for the $HD_{x,y}$ of connections belonging to the port P5 of the A-Hub 76a and for the $HD_{x,y}$ of connections belonging to the port P0 of the A-Hub 76b. With respect to the $HD_{x,y}$ of the other connections, "1" is set. In this case, the path calculator 69 designs path routing such that the path between the port P5 of the A-Hub 76a and the port P0 of the A-Hub 76b is preferentially adopted.

The foregoing is illustrative only of an example of setting the objective function, and the manner of how the objective function is set is not specifically limited to the aforementioned method.

Figure 16:
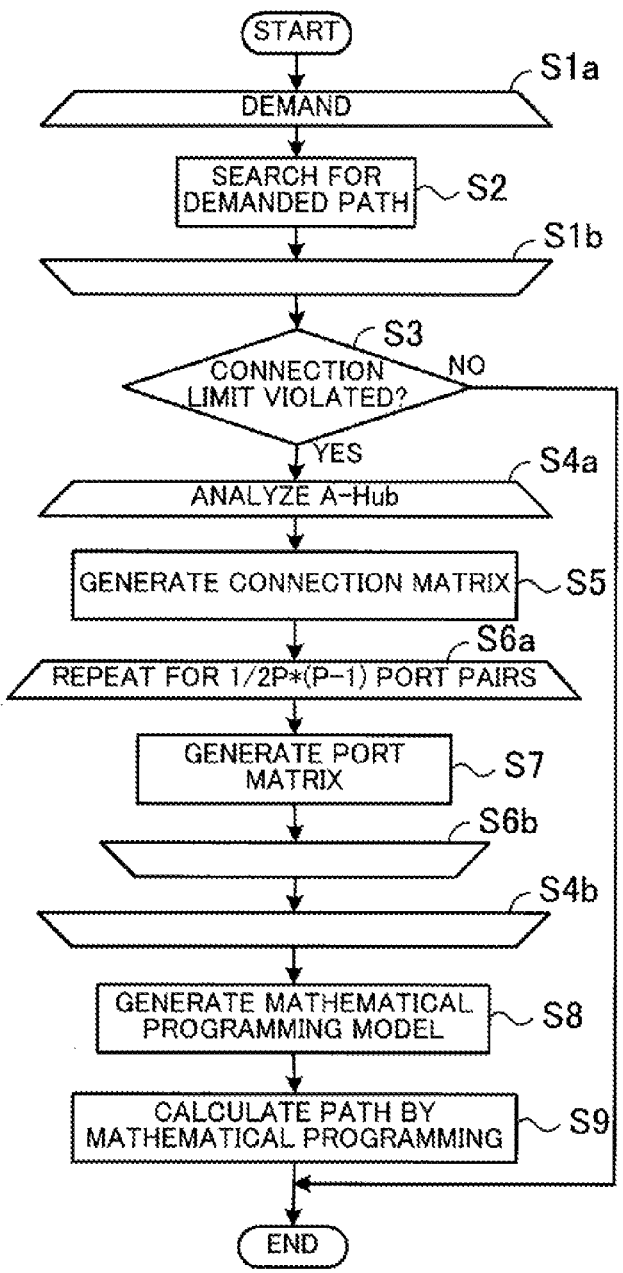
FIG. 16 is a flowchart illustrating the process of the optical network design apparatus.

FIG. 16 is a flowchart illustrating the process of the optical network design apparatus.

Step S1a to Step S1b: The path calculator 62 executes Step S2 a number of times corresponding to the number of the demands made by the operator.

Step S2: The path calculator 62 looks up the topology information storage 61 to search for a demanded path requested by the operator. When searching for a demanded path, the path calculator 62 takes no account of the connection limit. The path calculator 62 stores the result of the demanded path calculation in the path information storage 63.

Step S3: The path calculator 62 determines whether or not violation of the connection limit has occurred in the A-Hub through which the calculated demanded path passes. If the connection limit is not violated, the path calculator 62 ends the process. That is, the path calculator 62 ends the process because the derived demanded path meets the operator's request. If violation of the connection limit has occurred, on the other hand, the path calculator 62 proceeds to Step S4a.

Step S4a to Step S4b: For each of the A-Hubs with respect to which violation of the connection limit has occurred, the connection matrix generator 64 and the port matrix generator 66 execute Steps S5 to S7 described below.

Step S5: The connection matrix generator 64 looks up the topology information storage 61 and the path information storage 63 to generate a connection matrix, and then stores the generated connection matrix in the connection matrix table 65.

Step S6a to Step S6b: With respect to each port pair of the A-Hub, the port matrix generator 66 executes Step S7 described below. This process is repeated $1/2*P(P-1)$ times, where P is the number of the ports of the A-Hub.

Step S7: The port matrix generator 66 looks up the topology information storage 61 and the path information storage 63 to generate a port matrix, and then stores the generated port matrix in the port matrix table 67.

Step S8: The constraint generator 68 looks up the connection matrix table 65 and the port matrix table to generate a mathematical programming model. Specifically, the constraint generator 68 generates the constraint conditions and the objective function.

Step S9: Based on the mathematical programming model generated by the constraint generator 68, the path calculator 69 calculates paths by mathematical programming.

An amount of the path calculation described above (path calculation by the mathematical programming) will be now explained. Aside from the path search method described above, path search may be conducted, for example, by a method wherein a path is calculated without regard to the connection limit of the A-Hubs, determination is made as to whether or not violation of the connection limit has occurred in the calculated path, a to-be-deleted connection of the A-Hub, with respect to which the violation has occurred, is selected and deleted, and a path is again calculated. The following explains the amount of the path calculation in which to-be-deleted connections are selected and deleted, and the amount of the path calculation by the mathematical programming.

The amount of the path calculation by the method involving the selection and deletion of to-be-deleted connections is indicated by Expression (6) below.

$$N*C_{new}*D_{C\_new} \quad (6)$$

N denotes the total number of the A-Hubs within the optical network, $C_{new}$ denotes the number of to-be-deleted connections, and $D_{C\_new}$ denotes the number of the demanded paths belonging to any of the to-be-deleted connections.

For the purpose of comparison with the amount of the path calculation by the mathematical programming, the amount of calculation of $C_{new}$ will be expressed in terms of the number of ports of the A-Hub.

Where the number of to-be-deleted connections is largest, $C_{new}$ is given by: $C_{new}$=the number of combinations of full-mesh connections−the number of connections that can be set.

Provided that the connection limit of the individual ports is "4", the number of the to-be-deleted connections is given by the following Expression (7):

$$C_{new}=1/2*P(P-1)-P*4/2=1/2*P(P-4-1) \propto P^2 \quad (7)$$

P represents the number of the ports of the A-Hub. That is, the number of the to-be-deleted connections, $C_{new}$, can be regarded as proportional to the square of the number of the ports.

Thus, from Expressions (6) and (7), the amount of the path calculation involving the selection and deletion of to-be-deleted connections is given by Expression (8) below.

$$N*P^2*D_{C\_new} \quad (8)$$

On the other hand, the amount of the path calculation by the mathematical programming is expressed as $1/2*P(P-1)$ for one A-Hub, as explained above with reference to Steps S6a and S6b in FIG. 16. Accordingly, where the number of the A-Hubs is N, the calculation amount is given by Expression (9) below.

$$N*1/2*P(P-1) \propto N*P^2 \quad (9)$$

Comparison between Expressions (8) and (9) reveals that the method of calculating paths by selecting and deleting the to-be-deleted connections is dependent on the number of demands within the optical network. Accordingly, the method of calculating paths by the mathematical programming is smaller in the amount of calculation, making it possible to shorten the path calculation time.

As for the calculation of provisional paths without regard to the connection limit of the A-Hubs, the above two calculation methods are identical in terms of the amount of calculation. Also, compared with the method of calculating paths by selecting and deleting the to-be-deleted connections, the method of calculating paths by the mathematical programming additionally includes the process using the mathematical programming. The amount of calculation necessary for the mathematical programming was actually calculated on the assumption that there were three A-Hubs on the optical network ("3" is considered a number of A-Hubs that is likely to exist in an actual optical network). The result was approximately 0.1 s, which is considered to be sufficiently small.

Figure 17:
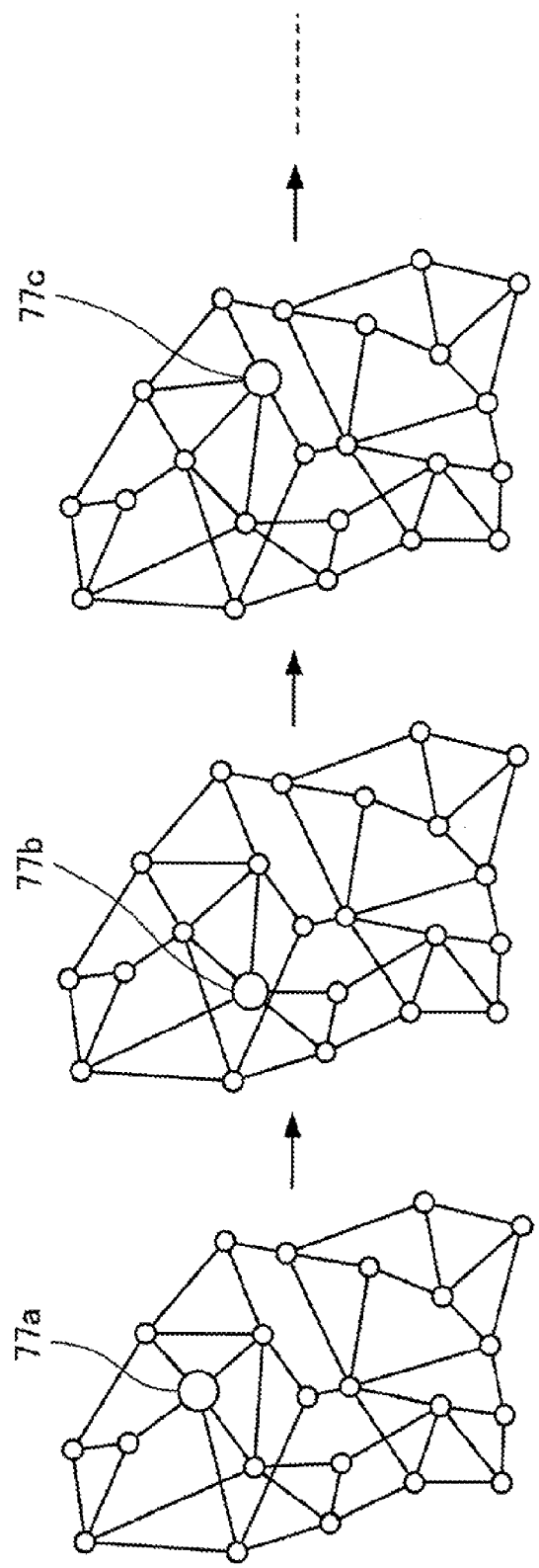
FIG. 17 is a conceptual diagram illustrating a method of calculating a path while selecting a to-be-deleted connection.

FIG. 17 is a conceptual diagram illustrating the method of calculating paths by selecting and deleting to-be-deleted connections. In FIG. 17, an optical network is illustrated. In the method of calculating paths by selecting and deleting to-be-deleted connections, the connections of A-Hubs 77a, 77b, 77c, . . . are successively adjusted one by one, as illustrated in FIG. 17, so as to resolve violation of the connection limit.

Figure 18:
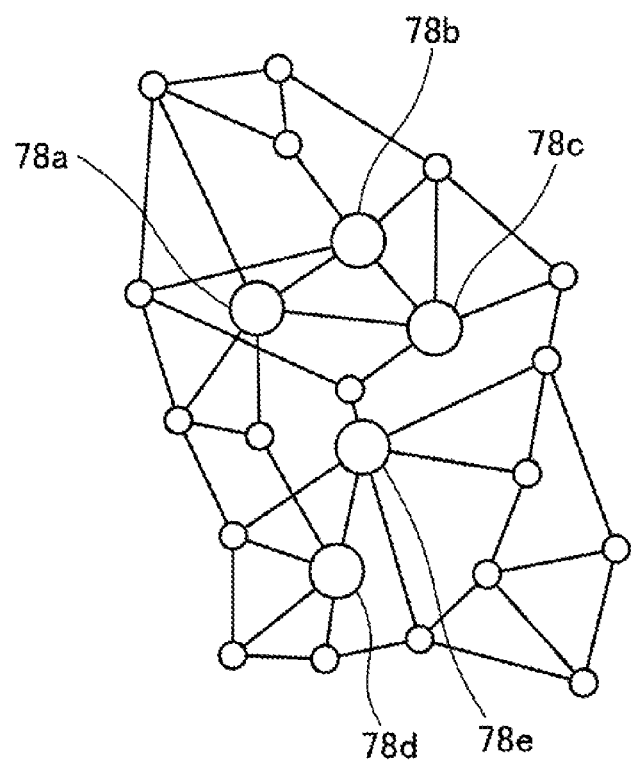
FIG. 18 is a conceptual diagram illustrating a method of calculating a path by mathematical programming.

FIG. 18 is a conceptual diagram illustrating the method of calculating paths by the mathematical programming. In FIG. 18, an optical network is illustrated. In the path calculation method explained above, the conditions (constraint conditions) for resolving all connection limits of A-Hubs 78a to 78e constituting the optical network are generated, and the mathematical programming is applied once to derive paths, as illustrated in FIG. 18. With the aforementioned path calculation method, therefore, it is possible to calculate paths optimized for the entire network.

In this manner, the optical network design apparatus 10 generates constraint conditions so that demanded paths satisfying the connection limits as well as the penalty limits may be adopted. Then, the optical network design apparatus 10 calculates final demanded paths by the mathematical programming under the generated constraint conditions. Accordingly, the optical network design apparatus can derive appropriate path routing results. For example, it is possible to derive paths satisfying both the connection limits and the penalty limits.

Third Embodiment

A third embodiment will be now described in detail with reference to the drawings. In the second embodiment, the constraint conditions are generated such that only one of each pair of the connection ports is switched so as to calculate paths. In the third embodiment, on the other hand, constraint conditions are generated such that both connection ports are switched so as to calculate paths.

Figure 19:
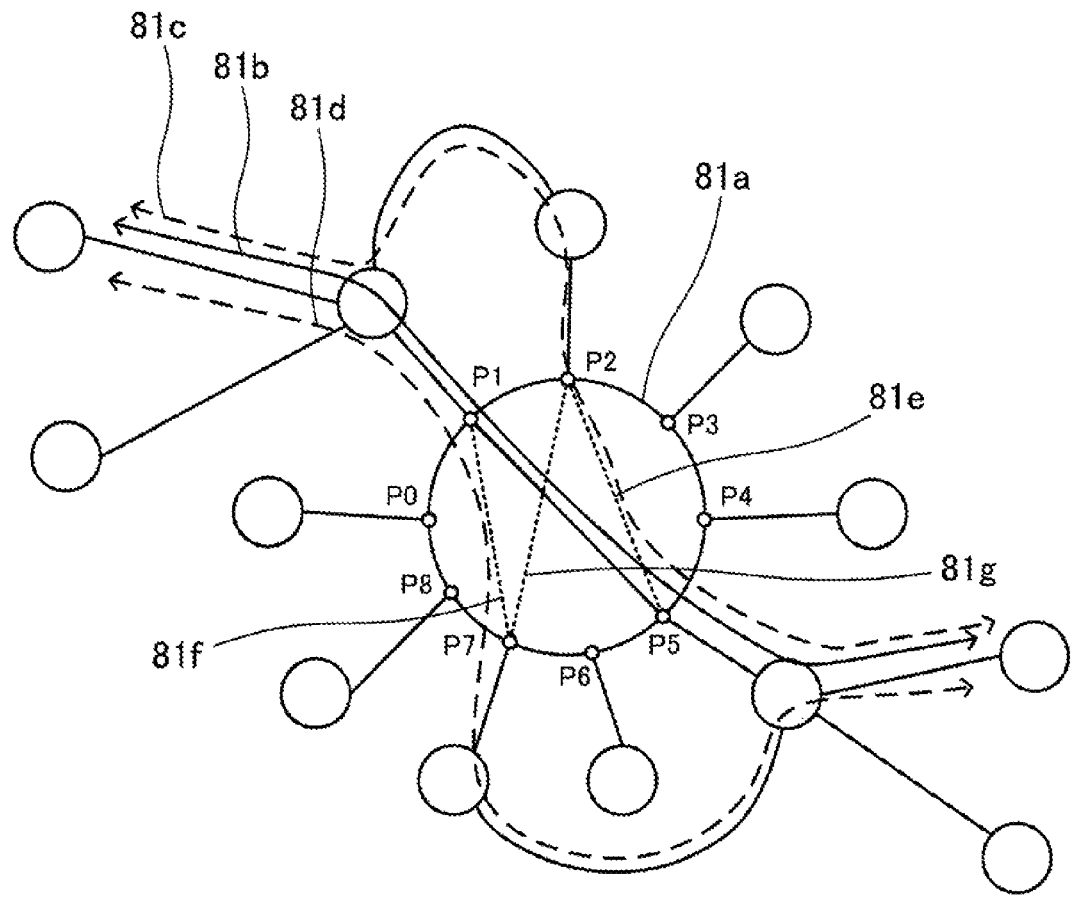
FIG. 19 is a diagram explaining a both-port constraint according to a third embodiment.

FIG. 19 is a diagram illustrating both-port constraint according to the third embodiment. In FIG. 19, an A-Hub 81*a* constituting an optical network is illustrated. The A-Hub 81*a* has ports P0 to P8. FIG. 19 also illustrates a path 81*b* calculated by the initial provisional design, and paths 81*c* and 81*d* each as a detour path therefor.

The path 81*b* calculated by the initial provisional design passes through the port connection P1-P5 of the A-Hub 81*a*. According to the second embodiment, one of the ports P1 and P5 is replaced by a replacement port under the single-port constraint, in order to divert the path 81*b* to the path 81*c* or 81*d*.

For example, in the case of a connection 81*e* between the ports P2 and P5 illustrated in FIG. 19, the port P1 is replaced by the replacement port P2, with the result that the path 81*b* is diverted to the path 81*c*. Also, in the case of a connection 81*f* between the ports P1 and P7 illustrated in FIG. 19, the port P5 is replaced by the replacement port P7, so that the path 81*b* is diverted to the path 81*d*.

According to the both-port constraint, both ports of the connection path calculated by the initial provisional design are replaced by replacement ports.

For example, both ports P1 and P5 of the connection path 81*b* calculated by the initial provisional design, illustrated in FIG. 19, are replaced by the ports P2 and P7, respectively. That is, in accordance with the both-port constraint, a connection 81*g* between the ports P2 and P7 is established as illustrated in FIG. 19.

The optical network design apparatus of the third embodiment has a hardware configuration and functional blocks identical with those exemplified in FIGS. 2 and 7, respectively, and therefore, description of the hardware configuration and the functional blocks is omitted. In the optical network design apparatus 10 according to the third embodiment, however, the functional block corresponding to the constraint generator 68 somewhat differs in function. In the third embodiment, the constraint generator 68 generates constraint conditions so that the connection derived by replacing both ports of a connection by replacement ports may also be adopted.

Like the second embodiment, the constraint generator 68 of the third embodiment generates a constraint condition related to the connection limit of the individual A-Hubs, as well as a constraint condition related to the detour path. As for the constraint condition related to the detour path, the constraint generator 68 generates the constraint condition from the constraint standpoints A and B.

In the second embodiment, where a certain demanded path needs to be diverted, the constraint generator 68 generates the constraint condition from the constrain standpoint A such that the detour path also satisfies the penalty limit. Also in the third embodiment, the constraint condition is generated in the same manner, but in addition, the constraint generator 68 generates the constraint condition so that the connection derived by replacing both ports of a connection by replacement ports may also be adopted.

The constraint condition according to the constraint standpoint A is indicated by Expression (10) below. In Expression (10), "Ahub" in the variable $S_{Ahub}(x, y)$ is omitted.

$$S(k, l) + \sum_{x \forall A_k} S(x, l) + \sum_{y \forall A_l} S(k, y) + \sum_{x, y \forall A_{kl}} S(x, y) \geq 1 \quad (10)$$

Compared with Expression (2), Expression (10) additionally includes a fourth term on its left-hand side. A substitutable candidate set $A_{k,1}$ in the fourth term is a set of replacement ports that can replace both ports of a connection (that can be used to divert the demanded path), and Expression (10) indicates that the connection derived by replacing both ports of a certain connection by replacement ports included in the substitutable candidate set $A_{k,1}$ is also adopted. With respect to both ports of a connection, the constraint generator 68 looks up the connection matrix table 65 and the port matrix table 67, and generates the constraint condition including the fourth term. The other constraint conditions are generated in the same manner as in the second embodiment, and therefore, description of the other constraint conditions is omitted.

Figure 20:
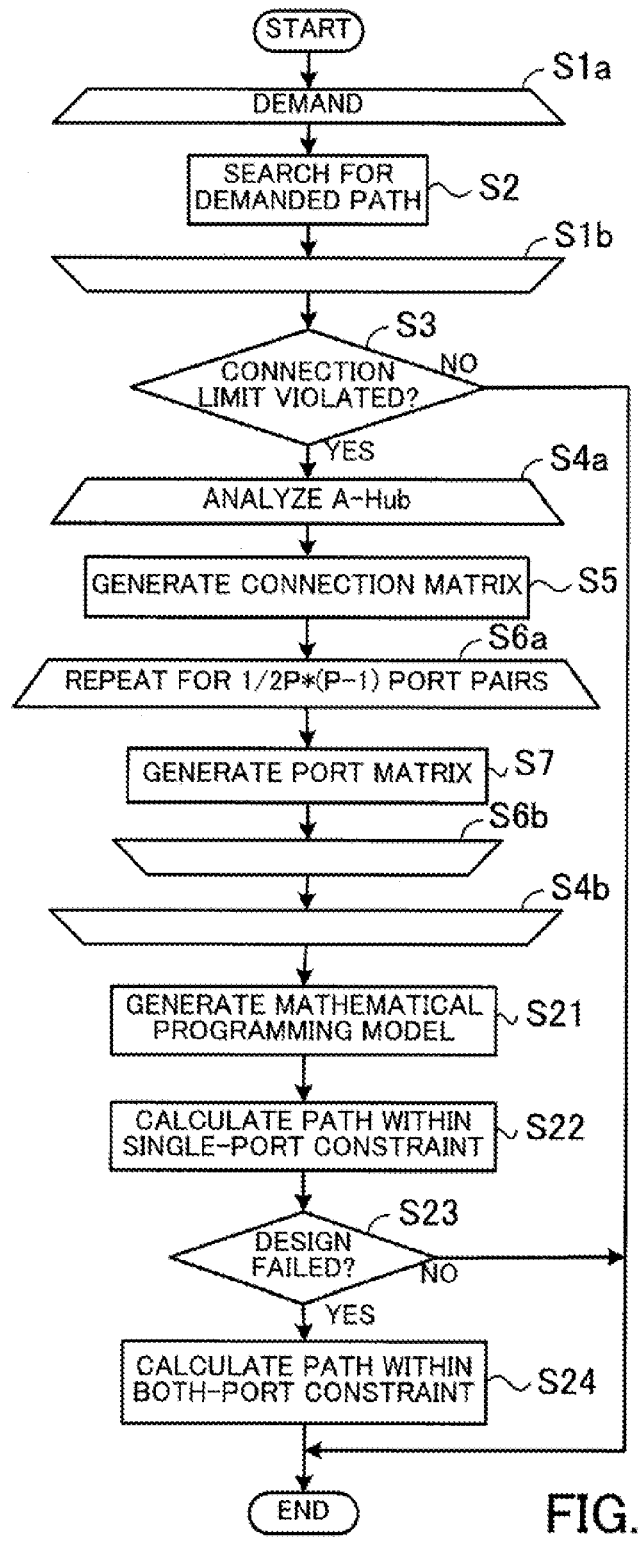
FIG. 20 is a flowchart illustrating the process of an optical network design apparatus.

FIG. 20 is a flowchart illustrating the process of the optical network design apparatus.

In FIG. 20, Steps S1*a* to S7 are identical with Steps S1*a* to S7 of FIG. 16, and accordingly, description of these steps is omitted.

Step S21: The constraint generator 68 looks up the connection matrix table 65 and the port matrix table to generate a mathematical programming model. Specifically, the constraint generator 68 generates the constraint conditions and the objective function. The constraint generator 68 generates the constraint condition for the single-port constraint indicated by Expression (2), as well as the constraint condition for the both-port constraint indicated by Expression (10).

Step S22: Based on the mathematical programming model generated by the constraint generator 68, the path calculator 69 calculates a path by the mathematical programming. That is, the path calculator 69 calculates a path under the single-port constraint.

Step S23: The path calculator 69 determines whether or not a path could be calculated. That is, the path calculator 69 determines whether or not a path could be successfully designed. If a path could be designed, the path calculator 69 ends the process; if a path could not be designed, the path calculator 69 proceeds to Step S24.

Step S24: Based on the mathematical programming model generated by the constraint generator 68, the path calculator 69 calculates a path by the mathematical programming. Specifically, the path calculator 69 calculates a path under the both-port constraint.

Thus, the optical network design apparatus 10 is also capable of designing paths under the both-port constraint.

Also, the optical network design apparatus 10 designs path routing under the both-port constraint in cases where path routing design under the single-port constraint has failed. Accordingly, if path routing can be designed under the single-port constraint, the path calculation time can be shortened.

Although, in the above description, path routing is designed under the both-port constraint when path routing design under the single-port constraint fails, the optical network design apparatus 10 may alternatively be configured to design path routing under the both-port constraint only. For example, in FIG. 20, Steps S22 and S23 may be omitted.

Fourth Embodiment

A fourth embodiment will be now described in detail with reference to the drawings. In the fourth embodiment, the port matrix alone is generated to calculate paths. An optical network design apparatus according to the fourth embodiment has a hardware configuration identical with that exemplified in FIG. 2, and therefore, description of the hardware configuration is omitted.

Figure 21:
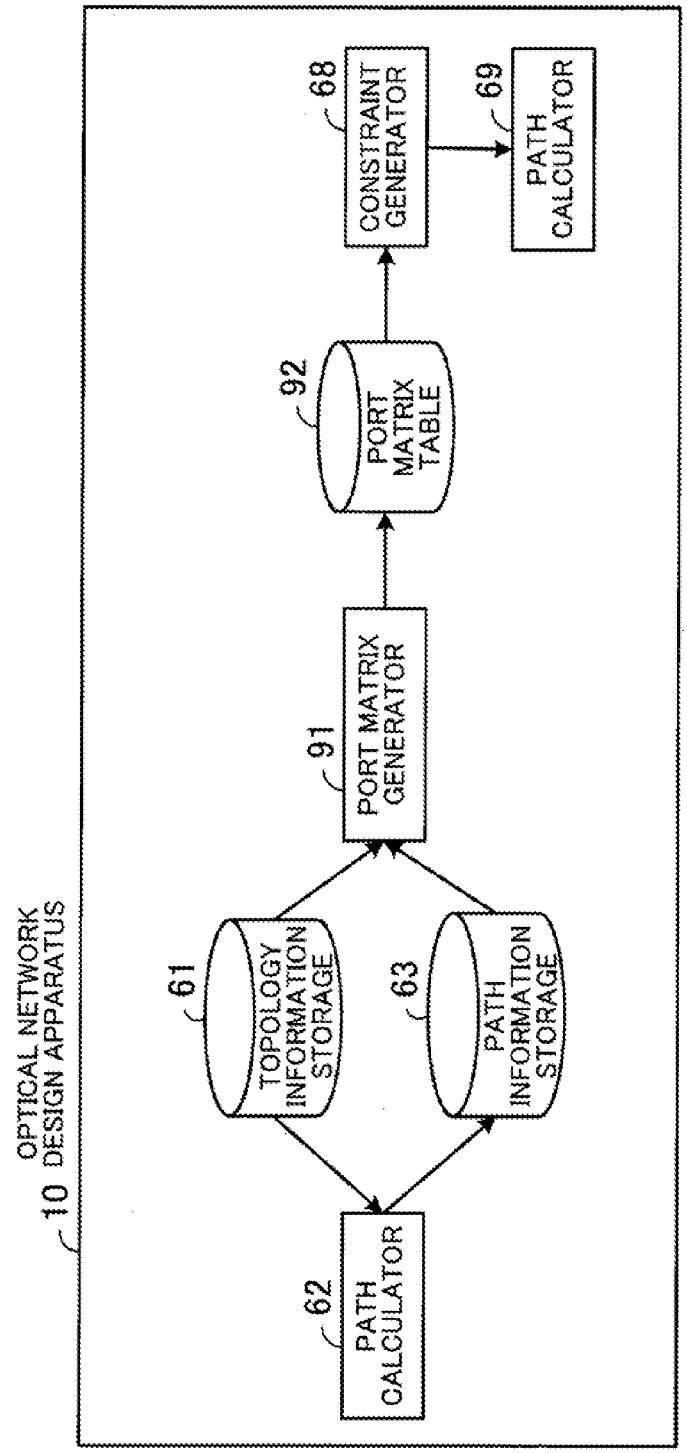
FIG. 21 is a functional block diagram of an optical network design apparatus according to a fourth embodiment.

FIG. 21 is a functional block diagram of the optical network design apparatus according to the fourth embodiment. In FIG. 21, like reference numerals are used to denote like elements also appearing in FIG. 7, and description of such elements is omitted.

As illustrated in FIG. 21, the optical network design apparatus 10 includes a port matrix generator 91 and a port matrix table 92.

The port matrix generator 91 looks up the topology information storage 61 and the path information storage 63 to generate a port matrix, and stores the generated port matrix in the port matrix table 92. Specifically, the port matrix generator 91 generates the port matrix with respect to all A-Hubs included in the optical network, and stores the generated port matrices in the port matrix table 92.

Figure 22:
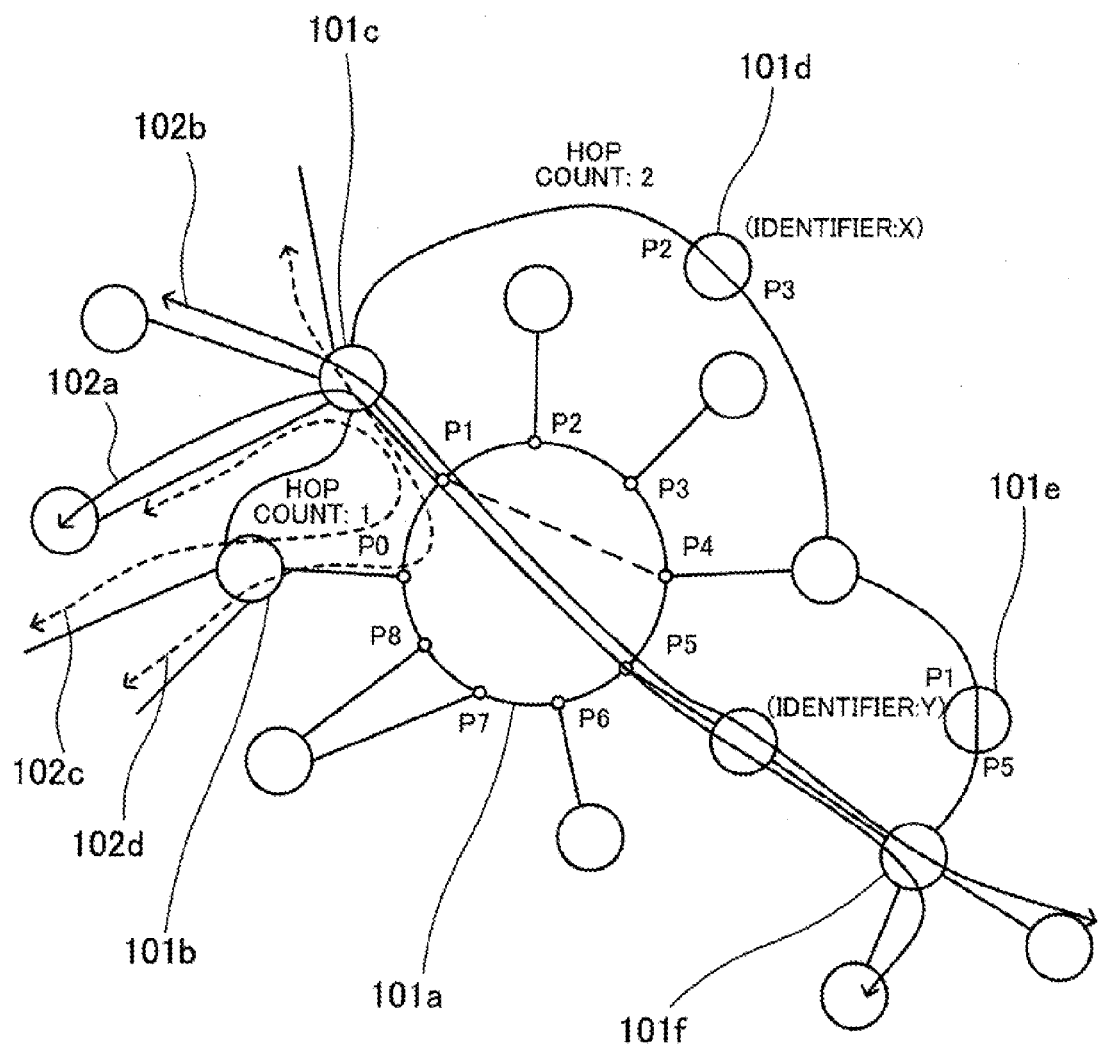
FIG. 22 is a diagram explaining generation of a port matrix.

FIG. 22 is a diagram explaining the generation of the port matrix. In FIG. 22, A-Hubs 101a, 101d and 101e and hubs 101b, 101c and 101f constituting an optical network is illustrated. It is assumed that the identifiers of the A-Hubs 101d and 101e are "X" and "Y", respectively. FIG. 22 also illustrates paths 102a to 102d.

In the second embodiment, hubs nearest to the currently focused A-Hub are identified, and a detour path connecting between the identified hubs is searched for. According to the fourth embodiment, on the other hand, hubs located at the opposite ends of a common path shared by the demanded paths passing through the currently focused A-Hub are identified, and a detour path connecting between the identified hubs is searched for.

Let it be assumed, for example, that in the example illustrated in FIG. 22, the paths 102a to 102d are calculated by the path calculator 62. Hubs located at the opposite ends of the common path shared by the paths 102a and 102b are the hubs 101c and 101f. Similarly, hubs located at the opposite ends of the common path shared by the paths 102c and 102d are the hubs 101b and 101c. The port matrix generator 91 acquires information about these hubs located at the opposite ends of the respective common paths. Where only one demanded path passes through a certain connection, the hubs located at the start and end points of the demanded path are regarded as the opposite ends of the common path.

After the hubs at the opposite ends of the common path are identified, the port matrix generator 91 searches for a detour path connecting between the identified hubs at the opposite ends of the common path. In this case, the port matrix generator 91 searches for a detour path under the condition that the detour path may not pass through that connection of the currently focused A-Hub which the common path passes through. Such a detour path is searched for by using a shortest path search algorithm such as Dijkstra's algorithm, for example.

In FIG. 22, for example, the hubs 101c and 101f are the hubs located at the opposite ends of the common path shared by the paths 102a and 102b, and the common path between the hubs 101c and 101f at the opposite ends passes through the port connection P1-P5. In this case, therefore, the port matrix generator 91 searches for a detour path for the common path between the hubs 101c and 101f at the opposite ends by Dijkstra's algorithm under the condition that the detour path may not pass through the port connection P1-P5 of the A-Hub 101a.

Also, in FIG. 22, the hubs located at the opposite ends of the common path shared by the paths 102c and 102d are the hubs 101b and 101c, and the common path between the hubs 101b and 101c at the opposite ends passes through the port connection P0-P1. Accordingly, in this case, the port matrix generator 91 searches for a detour path for the common path between the hubs 101b and 101c at the opposite ends by Dijkstra's algorithm under the condition that the detour path may not pass through the port connection P0-P1 of the A-Hub 101a.

If the penalty limit of the original path is not exceeded even though the common path is diverted to the calculated detour path, the port matrix generator 91 stores port information about the detour path in the port matrix table 92. Also, if an A-Hub other than the currently focused A-Hub is included in the detour path, the port matrix generator 91 stores, in the port matrix table 92, information about the included A-Hub as well as information about the connection of the included A-Hub through which the detour path passes.

That is, the port matrix generator 91 searches for a detour path which does not pass through the connection that the common path of the demanded paths passes through and which satisfies the penalty limit, calculates detour path information about the found detour path, and stores the calculated information in the port matrix table 92. Also, if the detour path includes an A-Hub, the port matrix generator 91 calculates information about the A-Hub and stores the calculated information in the port matrix table 92.

FIG. 23 illustrates an exemplary data structure of the port matrix table. As illustrated in FIG. 23, the port matrix table 92 has a column for target connections and a column for detour paths.

Information about the connection for which a detour path is calculated is stored under the target connection column. Under the target connection column, all combinations of the ports of the currently focused A-Hub are registered, for example.

Under the detour path column, information about the detour path for the corresponding target connection is stored. The detour path column holds, for example, information about the connection of the currently focused A-Hub through which the detour path passes and, if an A-Hub is included in the detour path, information about the included A-Hub as well as information about the connection of the included A-Hub through which the detour path passes.

In the example illustrated in FIG. 22, the port matrix generator 91 searches for a detour path connecting between the hubs 101c and 101f at the opposite ends of the common path under the condition that the detour path may not pass through the port connection P1-P5 of the A-Hub 101a. Let us suppose that as a result of the search by the port matrix generator 91, a detour path is found which passes through the hub 101c, the port connection P1-P4 of the A-Hub 101a, the hub connected to the port P4, the A-Hub 101e, and the hub 101f. Let it also be assumed that the detour path passes through the port connection P1-P5 of the A-Hub 101e without exceeding the penalty limit.

In this case, the port matrix generator 91 stores information about the port connection P1-P4 through which the detour path passes, in the detour path field corresponding to the field for the target port connection P1-P5 (the connection through which the common path passes) of the port matrix table 92. Also, since the A-Hub 101e separate from the A-Hub 101a is included in the calculated detour path, the port matrix generator 91 stores information about the A-Hub 101e (e.g., identifier "Y") as well as information about the connection (port connection P1-P5) of the A-Hub 101e through which the detour path passes, in the detour path field of the port matrix table 92.

If the penalty limit is exceeded because of the penalty of the detour path connecting between the hubs 101c and 101f, information indicating that no detour path is available is stored in the detour path field corresponding to the target port connection P1-P5.

Also, in the example illustrated in FIG. 22, the port matrix generator 91 searches for a detour path connecting between the hubs 101b and 101c at the opposite ends of the common path under the condition that the detour path may not pass through the port connection P0-P1 of the A-Hub 101a. Let it be assumed that as a result of the search by the port matrix generator 91, a detour path is found which passes through the hubs 101b and 101c, and that the penalty limit is not exceeded even though the detour path is used.

In this case, the port matrix generator 91 stores information about the detour path in the detour path field corresponding to the field for the target port connection P0-P1 (the connection through which the common path passes) of the port matrix table 92. Specifically, since the detour path does not pass through the A-Hub 101a, the port matrix generator 91 stores information indicating that there is no A-Hub to pass through. That is, the port matrix generator 91 stores the information that the detour path does not pass through the A-Hub 101a.

If the penalty limit is exceeded because of the penalty of the detour path connecting between the hubs 101b and 101c, information indicating that there is no detour path available is stored in the detour path field corresponding to the target port connection P0-P1.

In the example of FIG. 22, a detour path for the port connection P0-P2 does not exist (in FIG. 22, the opposite ends of the common path passing through the port connection P0-P2 are not illustrated). Accordingly, information indicating that there is no detour path available is stored in the detour path field corresponding to the target port connection P0-P2.

The constraint generator 68 generates the objective function in the same manner as explained above with reference to the second embodiment. Also, the constraint generator 68 looks up the port matrix table 92 to generate the constraint conditions in the same manner as explained above with reference to the second embodiment. Specifically, the constraint generator 68 generates the constraint condition related to the connection limit of the individual A-Hubs, and the constraint condition related to the detour path. For the constraint condition related to the detour path, the constraint generator 68 generates the constraint condition from the constraint standpoints A and B.

Let us suppose, for example, that the information illustrated in FIG. 23 is stored in the port matrix table 92. The constraint generator 68 generates the constraint condition with respect to each target connection.

Constraint Condition for P0-P1

The paths 102c and 102d can be diverted without passing through the A-Hub 101a. Accordingly, if the setting of the currently focused A-Hub 101a registered by the operator is that the A-Hub 101a may be bypassed, for example, the constraint generator 68 generates no constraint condition. That is, the variable $S_{A\text{-}Hub}(P0\text{-}P1)$ may be either "0" or "1". "A-Hub" in $S_{A\text{-}Hub}$ represents the A-Hub 101a.

On the other hand, if the setting of the currently focused A-Hub 101a registered by the operator is that the A-Hub 101a may not be bypassed, the constraint generator 68 generates the constraint condition indicated by the following Expression (11):

$$S_{A\text{-}Hub}(P0\text{-}P1) \geq 1 \tag{11}$$

That is, the constraint generator 68 generates the constraint condition so that the port connection P0-P1 of the A-Hub 101a may be adopted.

Constraint Condition for P0-P2

The port matrix table 92 of FIG. 23 indicates that there is no detour path available for the port connection P0-P2. Accordingly, the constraint generator 68 generates the constraint condition indicated by Expression (12) below, from the constraint standpoint A.

$$S_{A\text{-}Hub}(P0\text{-}P2) \geq 1 \tag{12}$$

That is, the constraint generator 68 generates the constraint condition so that the port connection P0-P2 of the A-Hub 101a may be adopted.

Constraint Condition for P1-P5

The port matrix table 92 illustrated in FIG. 23 indicates that there is a detour path available for the port connection P1-P5. Accordingly, the constraint generator 68 generates the constraint condition indicated by the following Expression (13), from the constraint standpoint A:

$$S_{A\text{-}Hub}(P1\text{-}P5) + S_{A\text{-}Hub}(P1\text{-}P4) \geq 1 \tag{13}$$

That is, the constraint generator 68 generates the constraint condition so that the port connection P1-P5 or the port connection P1-P4 or both may be adopted.

Also, the detour path passing through the port connection P1-P4 includes the A-Hub with the identifier "Y" (A-Hub 101e in FIG. 22). Since the detour path has to pass through the port connection P1-P5 of the A-Hub 101e, the constraint generator 68 generates the constraint condition indicated by the following Expression (14), from the constraint standpoint B:

$$S_{A\text{-}Hub}(P1\text{-}P4) - S_{A\text{-}HubY}(P1\text{-}P5) \geq 1 \tag{14}$$

"A-HubY" in the second term of the left-hand side of Expression (14) represents the A-Hub 101e.

That is, the constraint generator 68 generates the constraint condition so that if the port connection P1-P4 is adopted ($S_{A\text{-}Hub}(P1\text{-}P4)=1$), the port connection P1-P5 of the A-Hub 101e may be adopted ($S_{A\text{-}HubY}(P1\text{-}P5)=1$).

Using the constraint conditions and objective function generated by the constraint generator 68, the path calculator 69 calculates a path by the mathematical programming in the same manner as explained above with reference to the second embodiment.

In this manner, the optical network design apparatus 10 generates the constraint conditions on the basis of the connection limit, the detour path information (e.g., information about the ports of the currently focused A-Hub 101a through which the detour path passes), and the A-Hub information (e.g., information about the A-Hub 101e included in the detour path). Subsequently, under the constraint conditions thus generated, the optical network design apparatus 10 calculates a final demanded path by the mathematical programming. Accordingly, the optical network design apparatus 10 can derive appropriate path routing results. For example, it is possible to derive path routing results satisfying the connection limit as well as the penalty limit.

Fifth Embodiment

A fifth embodiment will be now described in detail with reference to the drawings. In the second embodiment, where neighboring A-Hubs are included in the detour path (a hub or hubs may be included in the path between the neighboring A-Hubs), the path between these A-Hubs is fixed. For example, as illustrated in FIG. 14, the path between the neighboring A-Hubs 75b and 75c is fixed. According to the fifth embodiment, a substitute path for the path between the neighboring A-Hubs included in the detour path is also searched for by a shortest path search algorithm such as Dijkstra's algorithm, for example, so that the substitute path may also be adopted as the detour path.

An optical network design apparatus according to the fifth embodiment has a hardware configuration and functional blocks identical with those exemplified in FIGS. 2 and 7, respectively, and thus description of the hardware configuration and the functional blocks is omitted. In the fifth embodiment, however, the functional block corresponding to the constraint generator 68 somewhat differs in function.

Figure 24:
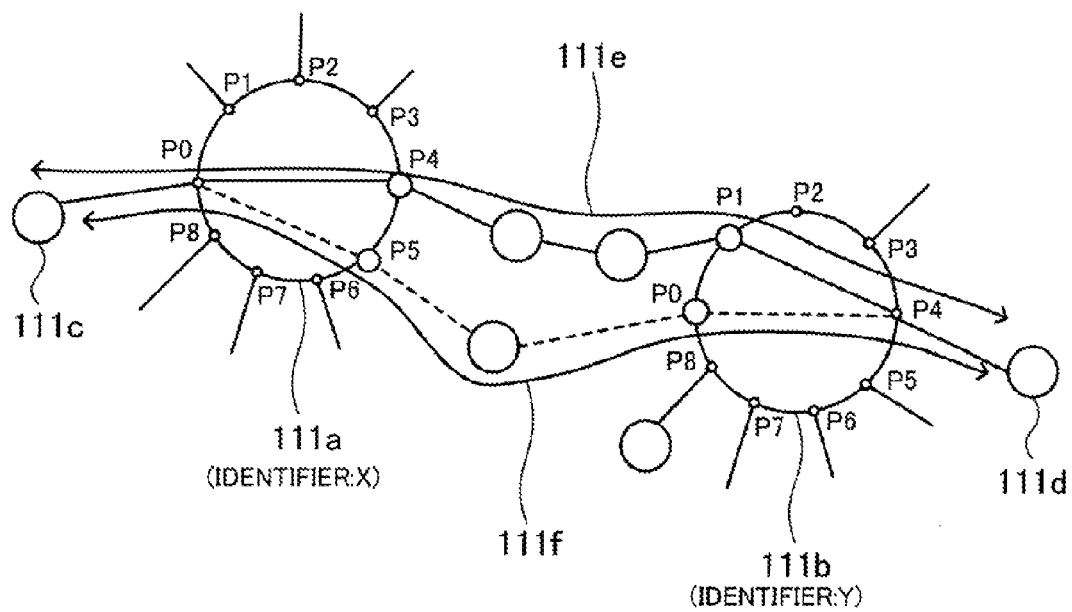
FIG. 24 is a diagram explaining a substitute path calculated according to a fifth embodiment.

FIG. 24 illustrates a substitute path calculated according to the fifth embodiment. In FIG. 24, A-Hubs 111a and 111b constituting an optical network are illustrated. The A-Hubs 111a and 111b each have ports P0 to P8. In FIG. 24, circles (except those indicating the ports P0 to P8) represent hubs. It is assumed here that the identifiers of the A-Hubs 111a and 111b are "X" and "Y", respectively.

A path 111e indicates a detour path calculated by the port matrix generator 66. Information (identifiers "X" and "Y") about the A-Hubs 111a and 111b included in the path 111e and connection information (port connections P0-P4 and P1-P4) are stored in the port matrix table 67. Although two hubs are included in the path between the A-Hubs 111a and 111b, these A-Hubs are neighboring A-Hubs because no A-Hub is included in the path therebetween.

The constraint generator 68 calculates a substitute path for the path 111e between hubs 111c and 111d which are nearest to the neighboring A-Hubs 111a and 111b. For example, the constraint generator 68 calculates a substitute path for the path between the hubs 111c and 111d by using a shortest path search algorithm such as Dijkstra's algorithm. Let it be assumed here that a path 111f is calculated as the substitute path, as illustrated in FIG. 24.

If the penalty of the calculated substitute path satisfies the penalty limit, the constraint generator generates a constraint condition so that one of the detour path and the substitute path may be adopted. The constraint condition is generated from the constraint standpoint B.

In the example illustrated in FIG. 24, the constraint generator 68 generates the constraint condition indicated by Expressions (15) to (17) below.

$$2 \times SS(AHX\_P0P4, AHY\_P1P4) - S_{A\text{-}HubX}(P0,P4) - S_{A\text{-}HubY}(P1,P4) \leq 0 \quad (15)$$

$$2 \times SS(AHX\_P0P5, AHY\_P0P4) - S_{A\text{-}HubX}(P0,P5) - S_{A\text{-}HubY}(P0,P4) \leq 0 \quad (16)$$

$$SS(AHX\_P0P5, AHY\_P0P4) + SS(AHX\_P0P4, AHY\_P1P4) \geq 1 \quad (17)$$

In Expression (15), a variable SS(AHX_P0P4, AHY_P1P4) indicates the path passing through the ports P0 and P4 of the A-Hub 111a and the ports P1 and P4 of the A-Hub 111b. Thus, if the value of the variable SS(AHX_P0P4, AHY_P1P4) is "1", for example, then it means that the path passing through the ports P0 and P4 of the A-Hub 111a and the ports P1 and P4 of the A-Hub 111b has been adopted. If the value of the variable SS(AHX_P0P4, AHY_P1P4) is "0", then it means that the path passing through the ports P0 and P4 of the A-Hub 111a and the ports P1 and P4 of the A-Hub 111b has not been adopted.

"AHX" in the variable SS(AHX_P0P4, AHY_P1P4) indicates the A-Hub 111a (identifier: "X") in FIG. 24, and "AHY" indicates the A-Hub 111b (identifier: "Y"). Also, in Expression (15), "A-HubX" and "A-HubY" in variables $S_{A\text{-}HubX}$ and $S_{A\text{-}HubY}$ respectively indicate the A-Hubs 111a and 111b in FIG. 24.

Expression (15) requires as the constraint condition that the value of the left-hand side of Expression (15) be smaller than or equal to "0". This means that, if the path passing through the ports P0 and P4 of the A-Hub 111a and the ports P1 and P4 of the A-Hub 111b, illustrated in FIG. 24, is adopted, the port connection P0-P4 of the A-Hub 111a and the port connection P1-P4 of the A-Hub 111b are adopted.

In Expression (16), a variable SS(AHX_P0P5, AHY_P0P4) indicates the path passing through the ports P0 and P5 of the A-Hub 111a and the ports P0 and P4 of the A-Hub 111b. Expression (16) specifies that, if the path passing through the ports P0 and P5 of the A-Hub 111a and the ports P0 and P4 of the A-Hub 111b, illustrated in FIG. 24, is adopted, the port connection P0-P5 of the A-Hub 111a and the port connection P0-P4 of the A-Hub 111b are adopted.

Expression (17) specifies that at least one of the paths indicated by the respective variables SS(AHX_P0P4, AHY_P1P4) and SS(AHX_P0P5, AHY_P0P4) is adopted. Namely, the path 111e or 111f illustrated in FIG. 24 is adopted.

Thus, the substitute path for the detour path can also be adopted, whereby the routing design capability is enhanced.

The following exemplifies advantageous effects of the path calculation by the mathematical programming, explained above with reference to the embodiments.

Figure 25:
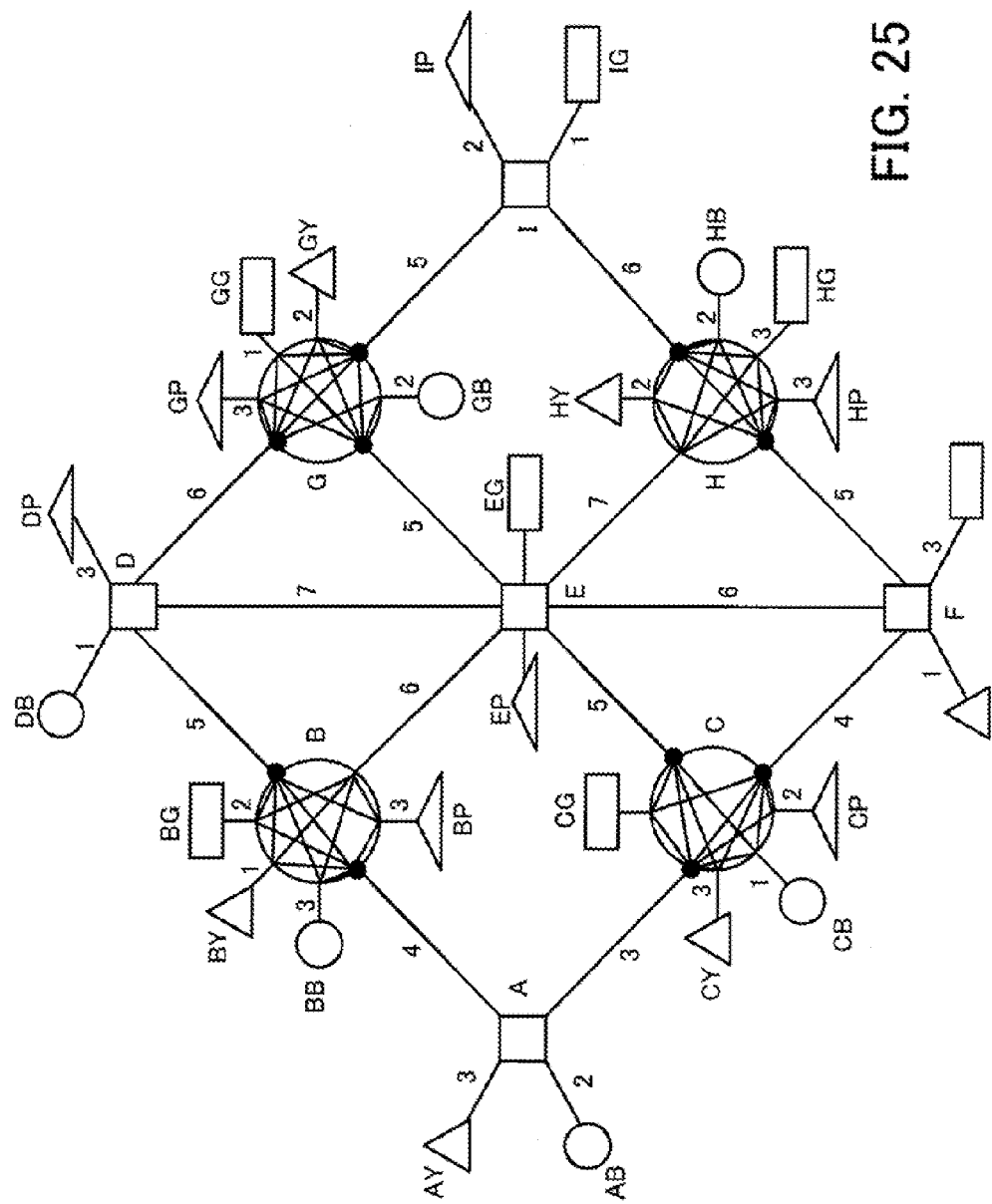
FIG. 25 illustrates an exemplary optical network to which a shortest path search algorithm is applied to calculate paths.

FIG. 25 illustrates an exemplary optical network to which a shortest path search algorithm is applied to calculate paths. In FIG. 25, alphabetical letters represent the identifiers of the respective hubs. Also, in FIG. 25, "B", "C", "G" and "H" represent A-Hubs, and numeric characters indicate penalties.

FIG. 26 illustrates demands. Let us suppose that in compliance with the demands illustrated in FIG. 26, the optical network of FIG. 25 is searched for paths.

Where paths are searched for in the optical network of FIG. 25 by using a shortest path search algorithm, such as Dijkstra's algorithm, without regard to violation of the connection limit, the connection limit is violated at the A-Hubs B, C, G and H, as indicated by filled circles in FIG. 25. In the exemplary network of FIG. 5, the connection limit is assumed to be "4".

Figure 27:
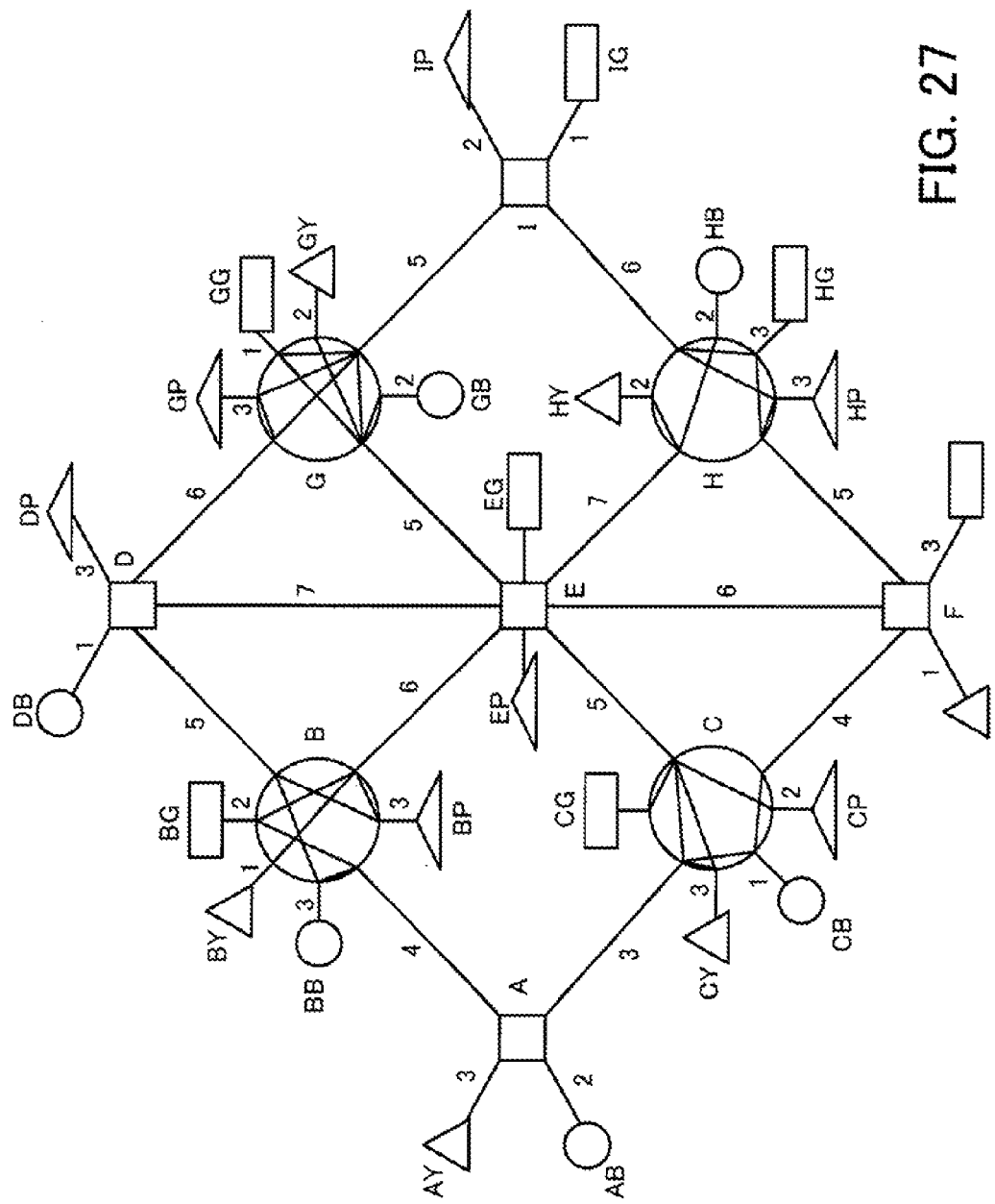
FIG. 27 illustrates an exemplary optical network to which mathematical programming is applied to calculate paths.

FIG. 27 illustrates an exemplary optical network to which the mathematical programming is applied to calculate paths. The optical network of FIG. 27 is identical with that illustrated in FIG. 25, and therefore, description thereof is omitted.

FIG. 28 illustrates the results of path calculation by the mathematical programming. Specifically, FIG. 28 illustrates the results of calculation of paths across the optical network of FIG. 27, wherein the connection limit and the penalty limit are set to "4" and "24", respectively. Where the constraint conditions are generated taking account of violation of the connection limit in the optical network of FIG. 27 and paths are calculated by the mathematical programming, paths are derived as illustrated in FIG. 28.

By calculating paths in the aforementioned manner by the mathematical programming, it is possible to obtain appropriate path routing results satisfying the connection limit as well as the penalty limit. Further, compared with the path calculation method in which to-be-deleted connections are selected and deleted, the path calculation time can be shortened.

The processing functions described above can be implemented by a computer. In this case, a program is prepared in which is described the process for performing the functions of the optical network design apparatus. The program is executed by a computer, whereupon the aforementioned processing functions are accomplished by the computer. The program describing the process may be recorded on computer-readable recording media. As such computer-readable recording media, magnetic storage devices, optical discs, magneto-optical recording media, semiconductor memories and the like may be used. Magnetic storage devices include hard disk drive (HDD), flexible disk (FD) and magnetic tape. Optical discs include DVD, DVD-RAM, and CD-ROM/RW. Magneto-optical recording media include MO (Magneto-Optical disk).

To market the program, portable recording media, such as DVDs and CD-ROMs, on which the program is recorded may be put on sale. Alternatively, the program may be stored in the storage device of a server computer and may be transferred from the server computer to other computers via a network.

A computer which is to execute the program stores in its storage device the program recorded on a portable recording medium or transferred from the server computer, for example. Then, the computer loads the program from its storage device and executes the process in accordance with the program. The computer may load the program directly from the portable recording medium to perform the process in accordance with the program. Also, as the program is transferred from the server computer to which the computer is connected via the network, the computer may sequentially execute the process in accordance with the received program.

Further, at least some of the aforementioned processing functions may be implemented by an electronic circuit such as a DSP (Digital Signal Processor), an ASIC (Application Specific Integrated Circuit), or a PLD (Programmable Logic Device).

With the apparatus and method disclosed herein, appropriate path routing results can be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. An optical network design apparatus for designing path routing across an optical network including an asymmetric optical hub which has a plurality of ports and of which a number of connections between the ports is limited, the apparatus comprising:
    a memory configured to store a connection limit corresponding to the number of connections between the ports; and
    a processor configured
        to provisionally design a traffic path across the optical network independently of a connection limit to which the number of connections of the asymmetric optical hub is limited,
        to calculate a penalty allowance with respect to a penalty limit of the provisionally designed traffic path, the penalty limit being a hub facility hop count or transmission delay allowed for the traffic path and the penalty allowance being a value of the allowance, relative to the penalty limit, of a penalty of the traffic path,
        to calculate, with respect to the asymmetric optical hub, an additional penalty caused on a detour path which is derived by replacing a port with a replacement port in the asymmetric optical hub,
        to generate, if an asymmetric optical hub is included in the detour path, asymmetric optical hub information about the asymmetric optical hub included in the detour path, the asymmetric optical hub information being connection information about the connection of the asymmetric optical path included in the detour path,
        to generate, based on the connection limit, the calculated penalty allowance, the calculated additional penalty, and the generated asymmetric optical hub information, a constraint condition for adopting the traffic path satisfying the connection limit and the penalty limit, and
        to calculate the traffic path by mathematical programming under the generated constraint condition.

2. The optical network design apparatus according to claim 1, wherein, in generating the constraint condition, a first constraint condition for adopting the traffic path satisfying the connection limit is generated based on the connection limit,
    a second constraint condition for adopting the traffic path which satisfies the penalty limit even if the port through which the traffic path passes is replaced with the replacement port is generated based on the calculated penalty allowance and the calculated additional penalty, and
    a third constraint condition for adopting the traffic path passing through a predetermined connection of the asymmetric optical hub included in the detour path is generated based on the generated asymmetric optical hub information when the asymmetric optical hub is included in the detour path derived by replacing the port with the replacement port.

3. The optical network design apparatus according to claim 1, wherein the constraint condition for adopting the traffic path which is derived by replacing a single port of a connection of the asymmetric optical hub with the replacement port is generated.

4. The optical network design apparatus according to claim 1, wherein the constraint condition for adopting the traffic path which is derived by replacing both ports of a connection of the asymmetric optical hub with the replacement ports is generated.

5. The optical network design apparatus according to claim 1, wherein, if the traffic path fails to be calculated under the constraint condition for adopting the traffic path which is derived by replacing a single port of a connection of the asymmetric optical hub with the replacement port, the traffic path is calculated under the constraint condition for adopting the traffic path which is derived by replacing both ports of the connection of the asymmetric optical hub with the replacement ports.

6. The optical network design apparatus according to claim 1, wherein in generating the constraint condition, an objective function is generated in accordance with a number of traffic paths passing through a connection of the asymmetric optical hub and calculated in provisionally designing the traffic path, such that the connection of the asymmetric optical hub is preferentially adopted, and the traffic path is calculated by the mathematical programming under the constraint condition and in accordance with the objective function.

7. The optical network design apparatus according to claim 1, wherein in generating the constraint condition, an objective function is generated such that a connection of the traffic path calculated in provisionally designing the traffic path is preferentially adopted, and the traffic path is calculated by the mathematical programming under the constraint condition and in accordance with the objective function.

8. The optical network design apparatus according to claim 1, wherein:

if the traffic path calculated in provisionally designing the traffic path passes through a plurality of the asymmetric optical hubs, an objective function is generated such that the calculated traffic path connecting between the asymmetric optical hubs is preferentially adopted, and the traffic path is calculated by the mathematical programming under the constraint condition and in accordance with the objective function.

9. The optical network design apparatus according to claim 1, wherein, if the detour path includes two asymmetric optical hubs, a separate detour path separate from the detour path is searched for, and the constraint condition is generated such that the separate detour path is also adoptable as the traffic path.

10. An optical network design apparatus for designing path routing across an optical network including an asymmetric optical hub which has a plurality of ports and of which a number of connections between the ports is limited, the apparatus comprising:

a memory configured to store a connection limit corresponding to the number of connections between the ports; and a processor configured to provisionally design traffic paths across the optical network independently of a connection limit to which the number of connections of the asymmetric optical hub is limited, to search, with respect to the asymmetric optical hub, for a detour path for a common path of the provisionally designed traffic paths in such a manner that the detour path satisfies a penalty limit without passing through a connection which the traffic paths pass through, and generate detour path information about the detour path, the penalty limit being a hub facility hop count or transmission delay allowed for the traffic path, to generate, if an asymmetric optical hub is included in the detour path found, asymmetric optical hub information about the included asymmetric optical hub, the asymmetric optical hub information being connection information about the connection of the asymmetric optical path included in the detour path, to generate, based on the connection limit, the generated detour path information and the generated asymmetric optical hub information, a constraint condition for adopting the traffic path satisfying the connection limit and the penalty limit, and to calculate the traffic path by mathematical programming under the generated constraint condition.

11. An optical network design method for an optical network design apparatus configured to design path routing across an optical network including an asymmetric optical hub which has a plurality of ports and of which a number of connections between the ports is limited, the method comprising:

provisionally designing a traffic path across the optical network independently of a connection limit to which the number of connections of the asymmetric optical hub is limited;

calculating a penalty allowance with respect to a penalty limit of the provisionally designed traffic path, the penalty limit being a hub facility hop count or transmission delay allowed for the traffic path and the penalty allowance being a value of the allowance, relative to the penalty limit, of a penalty of the traffic path;

calculating, with respect to the asymmetric optical hub, an additional penalty caused on a detour path which is derived by replacing a port with a replacement port in the asymmetric optical hub;

generating, if an asymmetric optical hub is included in the detour path, asymmetric optical hub information about the asymmetric optical hub included in the detour path, the asymmetric optical hub information being connection information about the connection of the asymmetric optical path included in the detour path;

generating, based on the connection limit, the penalty allowance, the additional penalty and the asymmetric optical hub information, a constraint condition for adopting the traffic path satisfying the connection limit and the penalty limit; and calculating the traffic path by mathematical programming under the generated constraint condition.

* * * * *